United States Patent
Ooishi et al.

(10) Patent No.: US 10,712,484 B2
(45) Date of Patent: Jul. 14, 2020

(54) MULTILAYER FILM, USE THEREOF, AND PRODUCTION METHOD THEREOF

(71) Applicant: ZEON CORPORATION, Chiyoda-ku, Tokyo (JP)

(72) Inventors: Hitoshi Ooishi, Tokyo (JP); Hiroaki Shu, Tokyo (JP)

(73) Assignee: ZEON CORPORATION, Chiyoda-ku, Tokyo (JP)

( * ) Notice: Subject to any disclaimer, the term of this patent is extended or adjusted under 35 U.S.C. 154(b) by 0 days.

(21) Appl. No.: 15/544,984

(22) PCT Filed: Jan. 28, 2016

(86) PCT No.: PCT/JP2016/052456
§ 371 (c)(1),
(2) Date: Jul. 20, 2017

(87) PCT Pub. No.: WO2016/121856
PCT Pub. Date: Aug. 4, 2016

(65) Prior Publication Data
US 2017/0363790 A1    Dec. 21, 2017

(30) Foreign Application Priority Data
Jan. 30, 2015 (JP) ................................. 2015-017335

(51) Int. Cl.
*G02B 5/30* (2006.01)
*G02F 1/13363* (2006.01)
(Continued)

(52) U.S. Cl.
CPC ......... *G02B 5/3016* (2013.01); *G02B 5/3083* (2013.01); *G02F 1/13363* (2013.01);
(Continued)

(58) Field of Classification Search
None
See application file for complete search history.

(56) References Cited

U.S. PATENT DOCUMENTS 5,132,147 A * 7/1992 Takiguchi .......... C09K 19/3804
    252/299.01
5,250,214 A * 10/1993 Kanemoto ......... C09K 19/3809
    252/299.01
(Continued)

FOREIGN PATENT DOCUMENTS

CN    1490636 A    4/2004
CN    1520525 A    8/2004
(Continued)

OTHER PUBLICATIONS

Apr. 19, 2016, International Search Report issued in the International Patent Application No. PCT/JP2016/052456.
(Continued)

*Primary Examiner* — Ryan Crockett
(74) *Attorney, Agent, or Firm* — Kenja IP Law PC

(57) ABSTRACT

A multilayer film including: a first long-length substrate; and an optically anisotropic layer containing cured liquid crystal molecules, the optically anisotropic layer being directly disposed on a surface of the first substrate, wherein the surface of the first substrate has a surface tension of 35 to 45 mN/m and an orientation-regulation force generated by stretching, and the optically anisotropic layer has a slow axis along approximately the same direction as an orientation direction of the first substrate by the stretching; and an optical compensation sheet, a λ/4 wave plate, a polarizing plate, a circularly polarizing plate, a liquid crystal display device, and an organic electroluminescent display device having the optically anisotropic layer, as well as production methods thereof.

19 Claims, 4 Drawing Sheets

(51) Int. Cl.
*G02F 1/1335* (2006.01)
*H01L 51/50* (2006.01)
*H01L 51/52* (2006.01)

(52) U.S. Cl.
CPC .... *G02F 1/133528* (2013.01); *H01L 51/5012* (2013.01); *H01L 51/5293* (2013.01); *G02F 2001/133541* (2013.01); *G02F 2001/133633* (2013.01); *G02F 2001/133638* (2013.01); *G02F 2413/01* (2013.01); *G02F 2413/02* (2013.01); *H01L 51/5281* (2013.01)

(56) References Cited

U.S. PATENT DOCUMENTS

| | | | |
|---|---|---|---|
| 5,833,880 | A | 11/1998 | Siemensmeyer et al. |
| 6,519,016 | B1 * | 2/2003 | Ichihashi ............ G02B 5/3083 |
| | | | 349/117 |
| 6,531,195 | B2 | 3/2003 | Negoro et al. |
| 6,699,405 | B2 | 3/2004 | Prechtl et al. |
| 6,793,986 | B2 | 9/2004 | Prechtl et al. |
| 7,754,912 | B2 | 7/2010 | Irisawa et al. |
| 7,771,616 | B2 | 8/2010 | Irisawa et al. |
| 9,207,360 | B2 | 12/2015 | Sakamoto et al. |
| 2004/0052950 | A1 * | 3/2004 | Kondou .................. F26B 13/10 |
| | | | 427/372.2 |
| 2004/0189909 | A1 | 9/2004 | Kashima |
| 2005/0157157 | A1 * | 7/2005 | Tsukamoto ............ B41M 5/265 |
| | | | 347/213 |
| 2008/0094326 | A1 * | 4/2008 | Yamaki ................ G02B 27/281 |
| | | | 345/87 |
| 2008/0316418 | A1 * | 12/2008 | Harding ................ C09K 19/56 |
| | | | 349/163 |
| 2009/0068345 | A1 * | 3/2009 | Ishida ............... G02F 1/133711 |
| | | | 427/68 |
| 2011/0200873 | A1 * | 8/2011 | Hu .......................... B32B 15/16 |
| | | | 429/188 |
| 2011/0252899 | A1 * | 10/2011 | Felts ..................... C23C 16/045 |
| | | | 73/865.8 |
| 2013/0141681 | A1 * | 6/2013 | Takahashi ............ G02B 5/3041 |
| | | | 349/117 |
| 2016/0145363 | A1 | 5/2016 | Sakamoto et al. |
| 2016/0251539 | A1 * | 9/2016 | Hustad ................. C09D 153/00 |
| | | | 427/385.5 |

FOREIGN PATENT DOCUMENTS

| | | |
|---|---|---|
| CN | 101382705 A | 3/2009 |
| JP | H039325 A | 1/1991 |
| JP | H0850206 A | 2/1996 |
| JP | H0995467 A | 4/1997 |
| JP | H1152131 A | 2/1999 |
| JP | H11513360 A | 11/1999 |
| JP | 2001091741 A | 4/2001 |
| JP | 2002030042 A | 1/2002 |
| JP | 2002098836 A | 4/2002 |
| JP | 2002321302 A | 11/2002 |
| JP | 2004122119 A | 4/2004 |
| JP | 2004204190 A | 7/2004 |
| JP | 2005263789 A | 9/2005 |
| JP | 2006307150 A | 11/2006 |
| JP | 2007119415 A | 5/2007 |
| JP | 2007186430 A | 7/2007 |
| JP | 2008176304 A | 7/2008 |
| JP | 2008209509 A | 9/2008 |
| JP | 2008242094 A * | 10/2008 |
| JP | 2010151971 A | 7/2010 |
| WO | 2012147904 A1 | 11/2012 |

OTHER PUBLICATIONS

C. Destrade et al., Disc-Like Mesogens: A Classification, Molecular Crystals and Liquid Crystals, 1981, pp. 111-135, vol. 71.

The Chemical Society of Japan, Chemistry of Liquid Crystal, Quarterly Chemical Review, 1994, No. 22, Chapter 5 and Section 2 of Chapter 10.

Jinshan Zhang et al., Liquid Crystals Based on Shape-Persistent Macrocyclic Mesogens, J. Am. Chem. Soc., 1994, p. 2655, vol. 116.

Aug. 1, 2017, International Preliminary Report on Patentability issued in the International Patent Application No. PCT/JP2016/052456.

\* cited by examiner

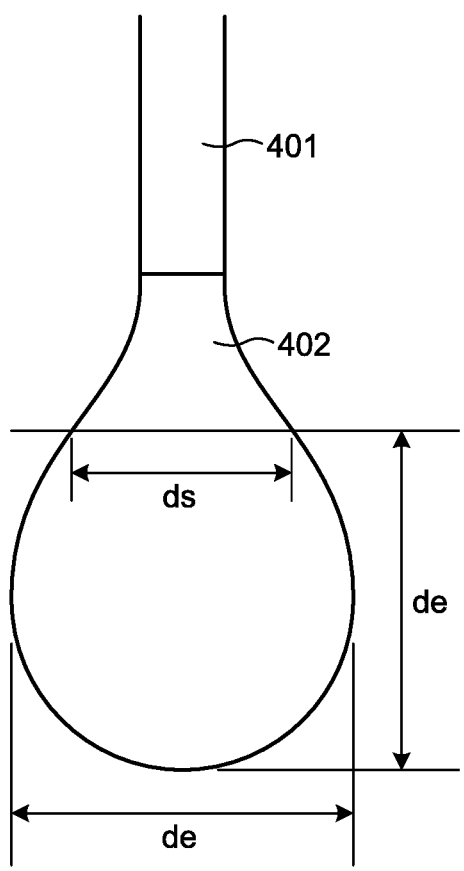

MULTILAYER FILM, USE THEREOF, AND PRODUCTION METHOD THEREOF

FIELD

The present invention relates to a multilayer film that has an optically anisotropic layer. The present invention also relates to an optical compensation sheet, a λ/4 wave plate, a polarizing plate, a circularly polarizing plate, a liquid crystal display device, and an organic electroluminescent display device having the optically anisotropic layer, and a production method.

BACKGROUND

As a component of various types of display devices, such as a liquid crystal display device and an organic electroluminescent display device, a phase difference plate, that is, an optical member having a phase difference, is widely used.

As one of methods for obtaining a phase difference plate, there has been known a method in which a compound capable of exhibiting a liquid crystal phase is formed into a solid film while keeping the state of exhibiting the liquid crystal phase. Examples of such a method may include a method in which a film having optical anisotropy is formed by applying a composition containing various types of curable liquid crystal compounds, such as a polymerizable compound capable of exhibiting a liquid crystal phase, onto a surface of a suitable substrate to form a layer of the composition, giving orientation to the liquid crystal compounds in the layer, and then polymerizing the liquid crystal compounds while maintaining their orientation state. Employment of such a method enables to obtain a phase difference plate in which a phase difference is uniformly developed in a plate surface. Further, by properly selecting the liquid crystal compounds, it becomes possible to obtain a phase difference plate that causes a uniform phase difference in a visible light wavelength region (for example, Patent Literature 1).

As the method for giving orientation to such a compound capable of exhibiting a liquid crystal phase, a method wherein an orientation-regulation force is imparted to a surface of a substrate, a composition containing the compound capable of exhibiting a liquid crystal phase is applied onto the surface, and then the substrate is placed under conditions suitable for orientation is commonly performed. Examples of the method for imparting the orientation-regulation force to the surface of the substrate may include a method by rubbing (for example, Patent Literatures 2 and 3). Further, it is also known that orientation of the liquid crystal compound on the film may be achieved by use of a film that has been subjected to a stretching treatment as a substrate, whereby an efficient production is performed (for example, Patent Literature 4).

CITATION LIST

Patent Literature

Patent Literature 1: Japanese Patent Application Laid-Open No. Hei. 11-52131 A
Patent Literature 2: Japanese Patent Application Laid-Open No. 2010-151971 A
Patent Literature 3: Japanese Patent Application Laid-Open No. 2002-098836 A (corresponding foreign publication: European Patent Application Publication No. 1079244)
Patent Literature 4: Japanese Patent Application Laid-Open No. Hei. 3-9325 A (corresponding foreign publication: U.S. Pat. No. 5,132,147)

SUMMARY

Technical Problem

However, the rubbing treatment has problems such as contamination of a foreign substance caused by static electricity generated during the treatment and a lack of sufficient orientation-regulation force. Further, the insufficient orientation-regulation force is also a problem when the film that has been subjected to the stretching treatment is used. As a result, there has been a problem that using such a film for a display device fails to achieve an excellent display quality due to a lack of sufficient orientation.

Therefore, an object of the present invention is to provide a multilayer film having an optically anisotropic layer, which can be efficiently produced and, when used for a display device, exhibit sufficient orientation to achieve an excellent display quality, as well as an optical compensation sheet, a λ/4 wave plate, a polarizing plate, a circularly polarizing plate, a liquid crystal display device, and an organic electroluminescent display device having the optically anisotropic layer, and a method for producing the same.

Solution to Problem

The present inventor has studied to solve the aforementioned problems and found that the aforementioned problems can be solved by using, as a substrate in a step of forming an optically anisotropic layer, a substrate having an orientation-regulation force by stretching and a specific surface tension, thereby completing the present invention.

Accordingly, the present invention provides the following.

(1) A multilayer film comprising: a first long-length substrate; and an optically anisotropic layer containing cured liquid crystal molecules, the optically anisotropic layer being directly disposed on a surface of the first substrate, wherein
the surface of the first substrate has a surface tension of 35 to 45 mN/m and an orientation-regulation force generated by stretching, and
the optically anisotropic layer has a slow axis along approximately the same direction as an orientation direction of the first substrate by the stretching.
(2) The multilayer film according to (1), wherein the first substrate comprises a plurality of layers.
(3) The multilayer film according to (1) or (2), wherein the cured liquid crystal molecule is a cured product of a discotic liquid crystal compound.
(4) The multilayer film according to (1) or (2), wherein the cured liquid crystal molecule is a cured product of a rod-like liquid crystal compound.
(5) A method for producing the multilayer film according to any one of (1) to (4), comprising:
applying a liquid crystal composition containing a curable liquid crystal compound onto a first long-length substrate to form a layer of the liquid crystal composition;
subjecting the curable liquid crystal compound in the layer of the liquid crystal composition to homogeneous orientation or hybrid orientation along approximately the same direction as an orientation direction of the first substrate by stretching; and polymerizing the curable liquid crystal compound to form cured liquid crystal molecules.

(6) The production method according to (5), wherein the liquid crystal composition is a liquid having a surface tension of 20 to 35 mN/m.

(7) An optical compensation sheet produced by:
separating, from the multilayer film according to (1), (2), or (3), the optically anisotropic layer; and
bonding the optically anisotropic layer to a second substrate.

(8) A λ/4 wave plate produced by:
separating, from the multilayer film according to (1), (2), or (4), the optically anisotropic layer; and
bonding the optically anisotropic layer to a second substrate.

(9) A polarizing plate comprising the optical compensation sheet according to (7).

(10) A circularly polarizing plate comprising the λ/4 wave plate according to (8).

(11) A liquid crystal display device comprising the polarizing plate according to (9).

(12) An organic electroluminescent display device comprising the circularly polarizing plate according to (10).

Advantageous Effects of Invention

In the multilayer film, the optical compensation sheet, the λ/4 wave plate, the polarizing plate, the circularly polarizing plate, the liquid crystal display device, and the organic electroluminescent display device of the present invention, the first substrate that has a long-length shape and has the orientation-regulation force generated by stretching is used, whereby the optically anisotropic layer therein can have sufficient orientation to achieve excellent display quality, and efficient production can be performed. In particular, when the first substrate to which the orientation-regulation force is imparted by oblique stretching is employed, the optically anisotropic layer produced using such a first substrate is suitable for the λ/4 wave plate and the circularly polarizing plate, and they can be efficiently produced. Further, the method for producing the multilayer film of the present invention enables to efficiently produce the multilayer film.

BRIEF DESCRIPTION OF DRAWINGS

FIG. 4 is a diagram illustrating a measurement of a surface tension of a liquid crystal composition by a pendant drop method.

DESCRIPTION OF EMBODIMENTS

Figure 1:
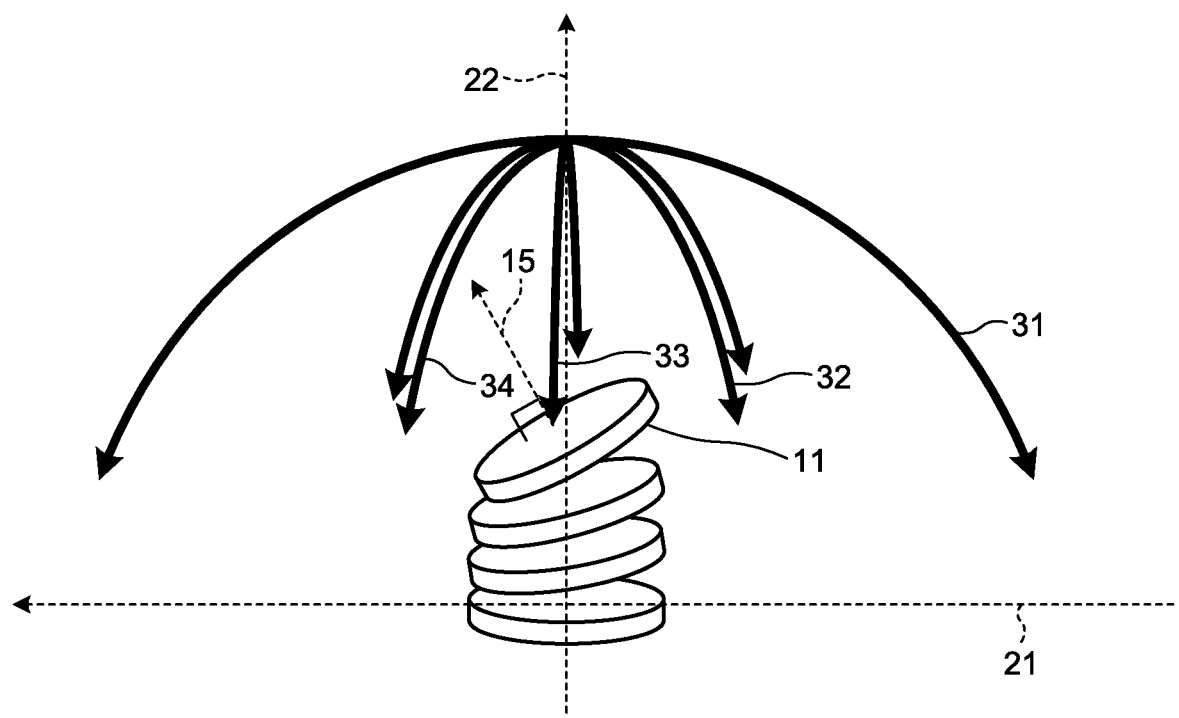
FIG. 1 is a perspective view schematically illustrating a state of hybrid orientation of discotic liquid crystal compounds.

Hereinafter, the present invention will be described in detail with reference to examples and embodiments, but the present invention is not limited to the following examples and embodiments and may be freely modified and practiced without departing from the scope of claims of the present invention and the scope of their equivalents.

In the present application, members such as a "polarizing plate", a "circularly polarizing plate", a "λ/2 wave plate", a "λ/4 wave plate", and a "phase difference plate" are not limited to a rigid member, and may include a film-like object having flexibility.

[1. Multilayer Film]

The multilayer film of the present invention includes a first long-length substrate and an optically anisotropic layer.

[1.1. First Substrate]

The first substrate used in the present invention is a long-length substrate. The term "long-length" used herein means a shape having a length that is 5 times or more longer than the width, and preferably 10 times or more longer than the width, and specifically means a shape of a film having such a length that the film can be wound up into a roll shape for storage or conveyance. Although the upper limit of the ratio of the length relative to the width of the film is not particularly limited, for example, the upper limit may be 100,000 times or less.

[1.2. Surface Tension of First Substrate]

The first substrate used in the present invention has a surface tension of 35 to 45 mN/m on a surface on a side where an optically anisotropic layer is to be provided. In the present application, the surface of the first substrate on the side where an optically anisotropic layer is to be provided may be simply referred to as the "surface" of the first substrate, when it is obvious from the context.

The surface tension of the surface of the first substrate is preferably 35 mN/m or more, and more preferably 37 mN/m or more, and is preferably 45 mN/m or less, and more preferably 40 mN/m or less. The surface tension of the surface of the first substrate may be adjusted within a desired range by appropriately selecting a material constituting the surface, a condition of a surface treatment applied to the surface, and the like. Examples of such a surface treatment may include a corona treatment, a plasma treatment, and a saponification treatment.

The measurement of the surface treatment of the first substrate may be performed, for example, using a surface tensiometer and a contact angle meter. In the measurement, a liquid droplet is made using pure water A3 (JIS K0557) as a measurement sample liquid and dropped onto the surface of the sample first substrate.

When a contact angle formed between the liquid droplet and the surface of the first substrate is measured using the contact angle meter, the surface tension may be calculated by using an empirical formula represented by formula I.

$$\cos\theta = 0.0467 \cdot \gamma_s - 1.508 \quad \text{(Formula I)}$$

$\theta$: contact angle (degree) of pure water, $\gamma_s$: surface tension (mN/m) of first substrate According to studies by the present inventor, when the surface tension of the surface of the first substrate is within the aforementioned range, as compared with the case where the surface tension of the surface of the first substrate is out of the aforementioned range, the optically anisotropic layer can be sufficiently oriented to achieve an excellent display quality when used for a display device. As a result, use of the optically anisotropic layer for the liquid crystal display device or the organic electroluminescent display device enables to achieve the excellent display quality by reducing white leak and the like. Whether the optically anisotropic layer is highly oriented or not may be evaluated by measuring a cross-Nicol transmittance of the optically anisotropic layer, as well as by observing a display quality of the display device, such as a liquid crystal display device and an organic electroluminescent display device, in which the optically anisotropic layer is installed.

[1.3. Orientation-Regulation Force of First Substrate]

The first substrate used in the present invention has an orientation-regulation force generated by stretching. Specifically, the first substrate is a film composed of one or more layers, obtained by giving a pre-stretch substrate a stretching treatment. The direction in which the orientation-regulation force is expressed by the stretching is usually the same direction as the orientation direction by the stretching. The orientation direction by the stretching refers to a direction of orientation of molecules constituting the first substrate generated by the stretching, and it is usually the same direction as the stretching direction itself.

The angle formed between the orientation direction of the first substrate by the stretching and the short-length direction of the first substrate may be 0° to 90°, and in particular, more than 0° and less than 90°. When the first substrate has such an orientation direction at an angle falling within such a range, the multilayer film of the present invention can be a material capable of efficiently producing a circularly polarizing plate, and the like.

In a certain aspect, the angle formed between the orientation direction of the first substrate and the short-length direction of the first substrate is preferably 10° to 60°, and particularly preferably 40° to 50°. When this angle relationship is satisfied, the multilayer film of the present invention can be a material capable of efficiently producing a specified circularly polarizing plate. Specifically, a circularly polarizing plate having a linear polarizer and one or two phase difference plates can be efficiently produced.

More specifically, when the angle formed between the orientation direction of the first substrate and the short-length direction of the first substrate is designed to fall within a specific range of preferably 15°±5°, 22.5°±5°, 45°±5°, or 75°±5°, more preferably 15°±4°, 22.5°±4°, 45°±4°, or 75°±4°, and further preferably 15°±3°, 22.5°±3°, 45°±3°, or 75°±3°, the multilayer film of the present invention can be a material capable of efficiently producing a specific circularly polarizing plate.

The stretching of the pre-stretch substrate for preparing the first substrate may be performed by oblique stretching alone, transverse stretching (i.e., stretching the first substrate in a short-length direction) alone, or a combination of the oblique stretching, lengthwise stretching (i.e., stretching the first substrate in a long-length direction), and/or the transverse stretching. The stretch temperature and the stretch ratio of the stretching may be appropriately set within a range allowing for generating the orientation-regulation force on the surface of the substrate.

[1.4. Material of First Substrate]

The first substrate may be composed of a single layer or a plurality of layers.

When the first substrate is composed of the plurality of layers, the first substrate includes, for example, a support body having one or more layers and an orientation film provided on one surface of the support body. In this case, the surface of the first substrate on a side of the orientation film may be provided with the optically anisotropic layer.

When the first substrate is composed of a single layer, the material of the layer is not particularly limited and various types of resins capable of imparting the orientation-regulation force to the surface due to birefringence may be used. Examples of the resins may include resins containing various types of polymers.

Examples of the polymers may include an alicyclic structure-containing polymer, a cellulose ester, a polyvinyl alcohol, a polyimide, a polycarbonate, a polysulfone, a polyether sulfone, an epoxy polymer, a polystyrene, an acrylic polymer, a methacrylic polymer, a polyethylene, a polypropylene, and combinations thereof. Among these, an alicyclic structure-containing polymer and a cellulose ester are preferable, and an alicyclic structure-containing polymer is more preferable from the viewpoint of transparency, low hygroscopicity, size stability, and low weight.

These materials may also be used as a material of the support body of the first substrate including the support body and the orientation film.

The alicyclic structure-containing polymer is an amorphous polymer having an alicyclic structure in a repeating unit. Both a polymer containing an alicyclic structure in a main chain and a polymer containing an alicyclic structure in a side chain may be used.

Examples of the alicyclic structure may include a cycloalkane structure and a cycloalkene structure. A cycloalkane structure is preferable from the viewpoint of thermal stability.

The number of carbon atoms constituting one repeating unit having the alicyclic structure is not particularly limited, but is usually 4 to 30, preferably 5 to 20, and more preferably 6 to 15.

The ratio of the repeating unit having the alicyclic structure in the alicyclic structure-containing polymer is appropriately selected depending on the purposes of use, and is usually 50% by weight or more, preferably 70% by weight or more, and more preferably 90% by weight or more.

When the ratio of the repeating unit having the alicyclic structure is too low, the heat resistance of the film may be decreased.

Specific examples of the alicyclic structure-containing polymer may include (1) a norbornene polymer, (2) a monocyclic olefin polymer, (3) a cyclic conjugated diene polymer, (4) a vinyl alicyclic hydrocarbon polymer, and hydrogenated products thereof.

Among these, a norbornene polymer and a hydrogenated product thereof are more preferable from the viewpoint of transparency and moldability.

Examples of the norbornene polymer may include a ring-opened polymer of a norbornene monomer, a ring-opened copolymer of a norbornene monomer with a ring-opening copolymerizable monomer other than the norbornene monomer, and hydrogenated products thereof; and an addition polymer of a norbornene monomer, and an addition copolymer of a norbornene monomer with a copolymerizable monomer other than the norbornene monomer.

Among these, a hydrogenated product of a ring-opened polymer of a norbornene monomer is the most preferable from the viewpoint of transparency.

The alicyclic structure-containing polymer is, for example, selected from known polymers disclosed in Japanese Patent Application Laid-Open No. 2002-321302 A and the like.

The glass transition temperature of the alicyclic structure-containing polymer is preferably 80° C. or higher, and more preferably within a range of 100 to 250° C.

The alicyclic structure-containing polymer having a glass transition temperature falling within this range is not deformed or does not generate stress during use at high temperature, and has excellent durability.

The molecular weight of the alicyclic structure-containing polymer as a weight-average molecular weight (Mw) measured by gel permeation chromatography (hereinafter abbreviated as "GPC") using cyclohexane (toluene when a resin is not dissolved) as a solvent in terms of polyisoprene (in terms of polystyrene when the solvent is toluene) is usually 10,000 to 100,000, preferably 25,000 to 80,000, and more preferably 25,000 to 50,000.

When the weight-average molecular weight thereof falls within such a range, the mechanical strength and molding processability of the film are highly balanced. Therefore, this is suitable.

Although the molecular weight distribution (weight-average molecular weight (Mw)/number-average molecular weight (Mn)) of the alicyclic structure-containing polymer is not particularly limited, the distribution usually falls within a range of 1 to 10, preferably 1 to 4, and more preferably 1.2 to 3.5.

In a resin containing the alicyclic structure-containing polymer, the content of a resin component having a molecular weight of 2,000 or less (i.e., oligomer component) is preferably 5% by weight or less, more preferably 3% by weight or less, and further preferably 2% by weight or less.

When the amount of the oligomer component falls within the aforementioned range, the generation of fine convex portions on a surface is decreased, the thickness unevenness is decreased, and the surface precision is improved.

Reduction of the amount of the oligomer component may be achieved by selection of a polymerization catalyst and a hydrogenation catalyst, reaction conditions of polymerization, hydrogenation, and the like, a temperature condition in a process of pelletizing the resin as a molding material, and the like.

The amount of the oligomer component may be measured by GPC described above.

When the resin containing the alicyclic structure-containing polymer is used as the material for the first substrate, the thickness of the first substrate is not particularly limited. However, the thickness of the first substrate is usually 1 to 1,000 µm, preferably 5 to 300 µm, and more preferably 30 to 100 µm from the viewpoints of productivity improvement and facilitation of decreasing in thickness and weight.

The resin containing the alicyclic structure-containing polymer may be composed only of the alicyclic structure-containing polymer. Alternatively, the resin may also contain any compounding agent as long as the effects of the present invention are not significantly impaired. The ratio of the alicyclic structure-containing polymer in the resin containing the alicyclic structure-containing polymer is preferably 70% by weight or more, and more preferably 80% by weight or more.

Specifically, suitable examples of the resin containing the alicyclic structure-containing polymer may include "ZEONOR 1420 and ZEONOR 1420R" available from ZEON Corporation.

A typical example of the cellulose ester is a lower fatty acid ester of cellulose (for example, cellulose acetate, cellulose acetate butyrate, and cellulose acetate propionate). A lower fatty acid means a fatty acid having 6 or less carbon atoms in one molecule. Cellulose acetate includes triacetylcellulose (TAC) and cellulose diacetate (DAC).

The acetylation degree of cellulose acetate is preferably 50 to 70%, and particularly preferably 55 to 65%. The weight-average molecular weight of cellulose acetate is preferably 70,000 to 120,000, and particularly preferably 80,000 to 100,000. The aforementioned cellulose acetate may be partially esterified with not only acetic acid but also a fatty acid, such as propionic acid and butyric acid, as long as the aforementioned acetylation degree is satisfied. The resin constituting the first substrate may contain cellulose acetate in combination with a cellulose ester other than cellulose acetate (cellulose propionate, cellulose butyrate, etc.). In this case, it is preferable that the entirety of the cellulose esters satisfy the aforementioned acetylation degree.

When a film of triacetylcellulose is used, it is particularly preferable that such a film is a triacetylcellulose film formed using triacetylcellulose dope that is prepared by dissolving triacetylcellulose in a solvent essentially free of dichloromethane by a low-temperature dissolution method or a high-temperature dissolution method from the viewpoint of environmental conservation. The film of triacetylcellulose may be produced by a co-casting method. The co-casting method may be performed by dissolving raw material flakes of triacetylcellulose in a solvent, and if necessary, adding an optional additive to prepare a solution (dope), casting the dope on a support from dope supply means (die), drying the cast product to some extent, separating the cast product as a film from the support when rigidity has been imparted thereto, and further drying the film to remove the solvent. Examples of the solvent for dissolving the raw material flakes may include halogenated hydrocarbons (dichloromethane, etc.), alcohols (methanol, ethanol, butanol, etc.), esters (methyl formate, methyl acetate, etc.), and ethers (dioxane, dioxolane, diethyl ether, etc.). Examples of the additive added to the dope may include a retardation-increasing agent, a plasticizer, an ultraviolet ray absorber, a deterioration preventing agent, a lubricant, and a separation promoter. Examples of the support on which the dope is cast may include a horizontal endless metal belt and a rotation drum. For casting, a single dope may be cast in a single layer. Alternatively, co-casting of a plurality of layers may also be performed. In co-casting in a plurality of layers, for example, a plurality of dopes may be successively cast so that a layer of a low-concentration cellulose ester dope and layers of a high-concentration cellulose ester dope in contact with the front and back surfaces of the layer of the low-concentration cellulose ester dope are formed. Examples of means for drying the film to remove the solvent may include means for conveying the film to pass the film through a drying unit in which the interior portion is placed under conditions suitable for drying.

Preferable examples of the film of triacetylcellulose may include known films such as TAC-TD80U (available from Fuji Photo Film Co., Ltd.), and a film disclosed in JIII journal of technical disclosure No. 2001-1745. Although the thickness of the film of triacetylcellulose is not particularly limited, it is preferably 20 to 150 µm, more preferably 40 to 130 µm, and further preferably 70 to 120 µm.

[1.5. Material of First Substrate: Orientation Film]

A description will be given of a material of the orientation film when the first substrate includes the support body and the orientation film. As the material of the orientation film, a polymer that has a desired surface tension and a capability of expressing the orientation-regulation force by stretching may be used.

Examples of the polymer as the material of the orientation film may include a cellulose, a silane coupling agent, a polyimide, a polyamide, a polyvinyl alcohol, an epoxy acrylate, a silanol oligomer, a polyacrylonitrile, a phenol resin, a polyoxazole, a cyclized polyisoprene, a modified compound thereof, and a mixture thereof. A polyvinyl alcohol is particularly preferable.

The orientation film may be formed on the support body, which has optionally been subjected to a surface treatment such as a corona discharge treatment, by applying a solution in which a polymer is dissolved in water or a solvent onto the support body by a coating method such as a reverse gravure coating method, a direct gravure coating method, a die coating method, and a bar coating method, and drying the applied solution. The pre-stretch substrate including the support body and the orientation film is formed by these steps, and is further stretched, to obtain the first substrate for use. The thickness of the orientation film of the first substrate is not particularly limited and may be adjusted in a range of thickness allowing for obtaining the desired orientation-regulation force. The thickness of the orientation film is preferably 0.05 µm or more, and more preferably 0.1 µm or more, and is preferably 10 µm or less, and more preferably 5 µm or less.

[1.6. Method for Producing First Substrate]

The method for producing the first substrate is not particularly limited and the first substrate may be produced by molding the material mentioned above by a known method and stretching the molded material.

As the production method when the first substrate is composed of a plurality of layers, there may be adopted a method in which the pre-stretch substrate is formed by a multilayer extrusion molding method or a method in which a part of the layers is first formed and then the rest of the layers is disposed on the surface by coating, deposition, and the like operation, and the resulting pre-stretch substrate is stretched.

When the first substrate is subjected to a surface treatment to adjust the surface tension of the surface of the first substrate, the first substrate is preferably subjected to the surface treatment before being stretched from the standpoint of favorably expressing the orientation-regulation force.

[1.7. Formation of Optically Anisotropic Layer on First Substrate]

The multilayer film of the present invention includes the optically anisotropic layer that contains cured liquid crystal molecules directly disposed on the surface of the first substrate.

In the present application, the term "cured liquid crystal molecules" means molecules of a compound obtained by solidifying a compound capable of exhibiting a liquid crystal phase while keeping the state of exhibiting the liquid crystal phase. Examples of the cured liquid crystal molecules may include a cured product of a curable liquid crystal compound. More specifically, a polymer obtained by polymerizing a polymerizable liquid crystal compound may be mentioned. In the following description, this specific type of optically anisotropic layer containing the cured liquid crystal molecules is simply referred to as an "optically anisotropic layer", unless otherwise specified.

Disposal of the optically anisotropic layer "directly" on the surface of the first substrate means that the optically anisotropic layer is formed on the surface of the first substrate without intervention of other layers. When the optically anisotropic layer is directly disposed on the surface of the first substrate having a specific surface tension, the optically anisotropic layer can be highly oriented sufficient to achieve an excellent display quality when used for a display device.

The optically anisotropic layer may be typically formed on the first substrate by a method including:

Step (I): a step of applying the liquid crystal composition containing the curable liquid crystal compound onto the first long-length substrate to form a layer of the liquid crystal composition;

Step (II): a step of giving the curable liquid crystal compound in the layer of the liquid crystal composition a homogeneous orientation or hybrid orientation along approximately the same direction as the orientation direction of the first substrate by the stretching; and Step (III): a step of polymerizing the curable liquid crystal compound to form the cured liquid crystal molecules.

The step (I) may be performed by directory applying the liquid crystal composition onto one surface of the first substrate that is continuously conveyed. Examples of a coating method may include a curtain coating method, an extrusion coating method, a roll coating method, a spin coating method, a dip coating method, a bar coating method, a spray coating method, a slide coating method, a printing coating method, a gravure coating method, a die coating method, a cap coating method, and a dipping method. For example, in the case of the die coating method, when a lip direction of a die coater is disposed so as to be parallel to a short-length direction of the substrate, an application direction of the liquid crystal composition is aligned with a conveyance direction of the substrate, that is, a long-length direction of the substrate. The thickness of the layer of the liquid crystal composition to be applied may be appropriately set according to a desired thickness of the optically anisotropic layer.

The liquid crystal composition is preferably a liquid having a specific surface tension. The surface tension of the liquid crystal composition is preferably 20 mN/m or more, and more preferably 25 mN/m or more, and is preferably 35 mN/m or less, and more preferably 30 mN/m or less. When the surface tension of the first substrate falls within the specific range described above and the surface tension of the liquid crystal composition falls within this range, the liquid crystal composition can be readily applied onto the surface of the first substrate with less surface defects such as cissing, allowing for an easy production of the optically anisotropic layer having excellent optical characteristics.

The method for confining a surface tension value of the liquid crystal composition within the aforementioned range is not particularly limited, and, for example, the surface tension of the liquid crystal composition may be adjusted by appropriately selecting types and content ratios of a solvent, a surfactant, and other additives in the liquid crystal composition.

The surface tension of the liquid crystal composition may be measured by, for example, a surface tensiometer. In the measurement, a quantifying droplet is prepared and subjected to a pendant drop method, and the result is analyzed by the formula II to calculate the surface tension. In the formula II, droplet diameters de and ds may be obtained by measuring a droplet 402 dropped from a thin tube 401, as shown in FIG. 4.

$$\gamma_L = g \cdot \rho \cdot (de)^2 H^{-1} \quad \text{(Formula II)}$$

$\gamma_L$: surface tension of liquid crystal composition g: acceleration of gravity ρ: liquid density de: maximum droplet diameter $H^{-1}$: correction factor determined by ds/de ds: diameter at position up by de from lower end of droplet The step (II) may be achieved immediately by the application without requiring any additional operation. In some cases, the step (II) may be achieved by optionally performing an orientation treatment such as heating after the application. Conditions of the orientation treatment may be appropriately set depending on properties of the liquid crystal composition in use. As an example of the conditions, the orientation treatment may be performed at a temperature condition of 50 to 160° C. for 30 seconds to 5 minutes. By appropriately setting the composition of the liquid crystal composition in use and the treatment conditions, the curable liquid crystal compound can be oriented along approximately the same direction as the orientation direction of the first substrate by the stretching.

Prior to the step (II), a step of drying the layer of the liquid crystal composition may be optionally performed. Such a drying step may be performed by a drying method, such as natural drying, drying by heating, drying under reduced pressure, and drying by heating under reduced pressure. By the drying step, the solvent can be removed from the layer of the liquid crystal composition.

The step (III) may be performed by appropriately selecting a method suitable for properties of components (polymerizable compound, polymerization initiator, etc.) of the liquid crystal composition. Examples of such a method may include a method in which an active energy ray is irradiated and a thermal polymerization method. The method in which an active energy ray is irradiated is preferable as it can promote the reaction at room temperature without heating. In this method, the active energy ray to be irradiated may include light such as visible light rays, ultraviolet rays, and infrared rays, and any energy rays such as an electron beam. Among these, the method of irradiating light such as ultraviolet rays is preferable because of its simple operation. Ultraviolet rays are preferably irradiated at a temperature of 30° C. or lower. The lower limit of the temperature at the time of irradiating ultraviolet rays may be set to 15° C. or higher. The irradiation intensity of ultraviolet rays is in a range of usually 0.1 mW/cm$^2$ to 1000 mW/cm$^2$, and preferably 0.5 mW/cm$^2$ to 600 mW/cm$^2$. The irradiation time of ultraviolet rays is in a range of 1 second to 300 seconds, and preferably 5 seconds to 100 seconds. The integrated light amount of ultraviolet rays (mJ/cm$^2$) may be obtained by the ultraviolet ray irradiation intensity (mW/cm$^2$)×irradiation time (sec).

As a light source for irradiation with ultraviolet rays, a high-pressure mercury lamp, a metal halide lamp, and a low-pressure mercury lamp may be used.

[1.8. Optically Anisotropic Layer]

The optically anisotropic layer of the multilayer film of the present invention has a slow axis along approximately the same direction as the orientation direction of the first substrate by the stretching. Specifically, the cured liquid crystal molecules contained in the optically anisotropic layer exhibit orientation regularity caused by the orientation-regulation force of the first substrate, which in turn controls a direction of the slow axis. The cured liquid crystal molecules may have homogeneous orientation regularity or hybrid orientation regularity.

Herein, "having hybrid orientation regularity" means that the molecules have an orientation regularity in such a manner that the molecules near a surface of the first substrate are oriented horizontally with respect to the surface, and, as the molecules are apart from the surface to an air boundary side, the orientation of the molecules is inclined with respect to the horizontal direction. In a certain aspect of the present application, the cured liquid crystal molecules are a cured product of discotic liquid crystal compounds and the liquid crystal molecules in this aspect may exhibit the hybrid orientation.

Figure 2:
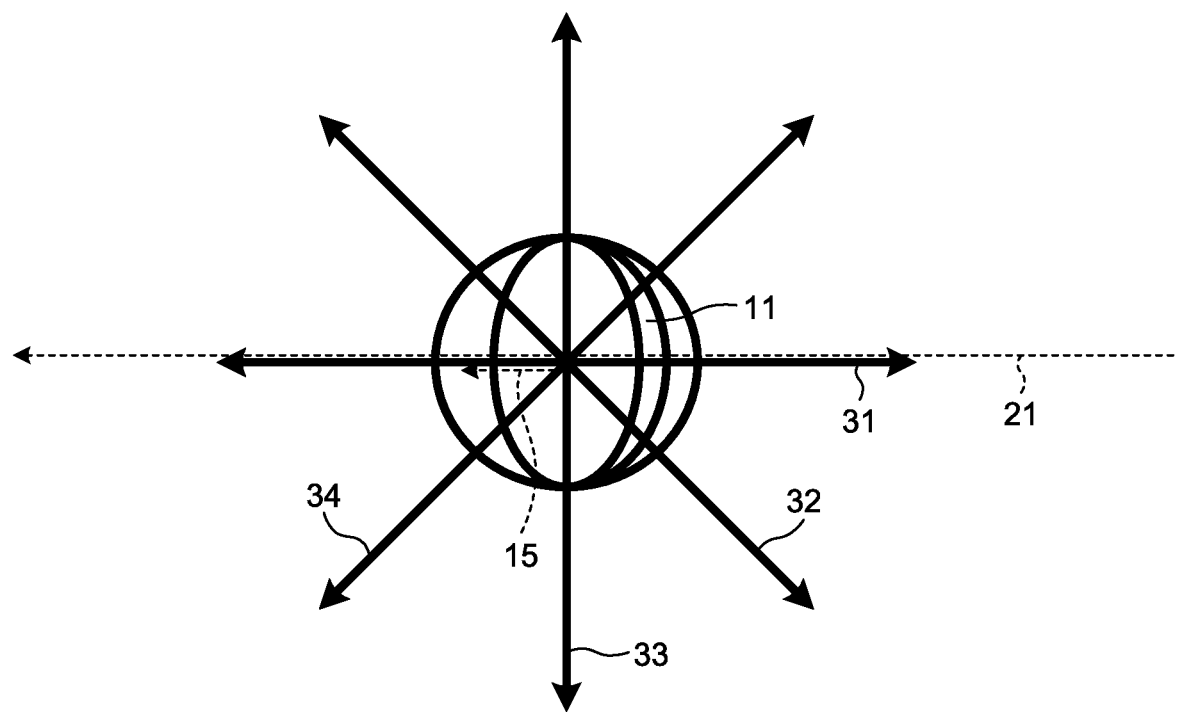
FIG. 2 is a top view schematically illustrating the state of hybrid orientation of discotic liquid crystal compounds.

Specific examples of the hybrid orientation will be described with reference to FIG. 1 and FIG. 2. FIG. 1 and FIG. 2 are the schematic perspective view and the schematic top view, respectively, of a state of the hybrid orientation of the discotic liquid crystal compounds. FIG. 1 and FIG. 2 show the orientation state of the discotic liquid crystal compounds 11 on the surface of the first substrate placed in the horizontal direction (direction orthogonal to arrow 22). The orientation direction of the first substrate by the stretching is shown by the arrow 21. In the discotic liquid crystal compounds 11, molecules located on a lower side, that is, near the surface of the first substrate, are oriented horizontally, while, as the molecules are apart from the surface to an upper side, the orientation of the molecules is inclined in a direction of arrow 15. The hybrid orientation of the discotic liquid crystal compounds like this may be confirmed by measuring refractive index anisotropy of the optically anisotropic layer in a polar angle 0° direction (direction of arrow 22), and directions inclined at various azimuth angles and polar angles from the polar angle 0° direction, such as those shown by arrows 31 to 34. The layer of the discotic liquid crystal compounds having such hybrid orientation usually has a slow axis in an inclining direction of the arrow 15. Thus, the layer usually has a slow axis in the direction of the arrow 21.

On the other hand, "having homogeneous orientation regularity" means that an average direction of lines obtained by projecting the long-axis directions of the mesogens of the cured liquid crystal molecules toward the surface of the first substrate is aligned with one of directions horizontal to the surface (for example, direction of surface director of substrate film). Further, having homogeneous orientation regularity "along" a specific direction means that the alignment direction is approximately the same direction as the specific direction described above. In the present application, the specific direction described above may be the orientation direction of the first substrate by the stretching. Whether the cured liquid crystal molecules have the homogeneous orientation regularity, and, if so, an alignment direction of the homogeneous orientation may be confirmed by measuring a slow axis direction and retardation distributions for each incident angle in the slow axis direction and a direction orthogonal to the slow axis, using a phase difference meter represented by an AxoScan (manufactured by Axometrics, Inc.).

Herein, when the cured liquid crystal molecules are obtained by polymerizing a polymerizable liquid crystal compound having a rod-like molecular structure, the long-axis direction of mesogen of the polymerizable liquid crystal compound is usually the long-axis direction of mesogen of the cured liquid crystal molecules. When a plurality of types of mesogens having different orientation directions exist in the optically anisotropic layer like in a case of using a polymerizable liquid crystal compound having inverse wavelength dispersion (described below) as the polymerizable liquid crystal compound, a direction in which the long-axis direction of mesogen of the longest type among the mesogens is aligned is referred to as the alignment direction.

In the present application, the slow axis being aligned along "approximately" the same direction as the orientation direction of the first substrate by the stretching means that an angle formed between the orientation direction of the first substrate by the stretching and the slow axis is 5° or less. The angle is preferably 3° or less, and more preferably 1° or less.

By using the specific first substrate as described above and appropriately selecting the material of the optically anisotropic layer, the orientation regularity along approximately the same direction as the orientation direction of the first substrate by the stretching can be imparted to the optically anisotropic layer. As a result, the optically anisotropic layer having such orientation regularity can be obtained.

The thickness of the optically anisotropic layer is not particularly limited. The thickness may be appropriately adjusted so that characteristics such as retardation fall within a desired range. Specifically, the lower limit of the thickness is preferably 0.5 µm or more, and more preferably 1.0 µm or more. On the other hand, the upper limit of the thickness is preferably 10 µm or less, more preferably 7 µm or less, and further preferably 5 µm or less.

The shape, and length and width of the optically anisotropic layer may be those of a long-length film like those of the first substrate. This optically anisotropic layer may be cut into a shape such as a rectangle suitable for desired application, if necessary.

It is preferable that the optically anisotropic layer has inverse wavelength dispersion. Specifically, it is preferable that the optically anisotropic layer has wavelength dispersion that exhibits higher in-plane phase difference for transmitted light having longer wavelength as compared with transmitted light having shorter wavelength. It is preferable that the optically anisotropic layer has inverse wavelength dispersion at at least a part of or preferably the entirety of visible light region. When the optically anisotropic layer has inverse wavelength dispersion, the function can be uniformly expressed over a wide region for optical applications such as a λ/4 wave plate and a λ/2 wave plate.

In a preferred aspect, the optically anisotropic layer has optical characteristics capable of being used as a λ/4 wave plate or a λ/2 wave plate. Specifically, when the in-plane retardation Re measured at a measurement wavelength of 550 nm falls within a range of 108 nm to 168 nm, the optically anisotropic layer may be used as a λ/4 wave plate. When the in-plane retardation Re measured at a measurement wavelength of 550 nm falls within a range of 245 nm to 305 nm, the optically anisotropic layer may be used as a λ/2 wave plate. More specifically, in a case of the λ/4 wave plate, the in-plane retardation Re measured at a measurement wavelength of 550 nm preferably falls within a range of 128 nm to 148 nm, and more preferably 133 nm to 143 nm. In a case of the λ/2 wave plate, the in-plane retardation Re measured at a measurement wavelength of 550 nm preferably falls within a range of 265 nm to 285 nm, and more preferably 270 nm to 280 nm. Herein, the in-plane retardation Re is calculated by the following formula.

Re=(nx−ny)×d (where nx represents a refractive index in the in-plane slow axis direction in the optically anisotropic layer (the in-plane maximum refractive index), ny represents a refractive index in an in-plane direction perpendicular to the slow axis in the optically anisotropic layer, and d represents a thickness (nm) of the optically anisotropic layer.)

When the optically anisotropic layer has such optical characteristics usable as a λ/4 wave plate or a λ/2 wave plate, the optically anisotropic layer can be used for easily producing an optical element such as a circularly polarizing plate having the λ/4 wave plate or the λ/2 wave plate.

The angle formed between the slow axis of the optically anisotropic layer and the short-length direction of the optically anisotropic layer may be the same as the angle formed between the orientation direction of the first substrate by stretching and the short-length direction of the first substrate. Specifically, the angle formed between the slow axis of the optically anisotropic layer and the short-length direction of the optically anisotropic layer may be specifically 0° to 90°. In a certain aspect, the angle formed between the slow axis of the optically anisotropic layer and the short-length direction of the optically anisotropic layer is particularly preferably 40° to 50°. Specifically, the angle formed between the slow axis of the optically anisotropic layer and the short-length direction of the optically anisotropic layer preferably falls within a specific range of 15°±5°, 22.5°±5°, 45°±5°, or 75°±5°, more preferably 15°±4°, 22.5°±4°, 45°±4°, or 75°±4°, and further preferably 15°±3°, 22.5°±3°, 45°±3°, or 75°±3°. When the optically anisotropic layer has such an angle relationship, the multilayer film of the present invention can be a material capable of efficiently producing a specific circularly polarizing plate.

[1.9. Liquid Crystal Composition]

The liquid crystal composition containing the polymerizable liquid crystal compound that may be used for production of the multilayer film of the present invention (hereinafter the composition is sometimes abbreviated as "composition (A)") will be described.

The liquid crystal compound as a component of the composition (A) herein is a compound capable of exhibiting a liquid crystal phase when the compound is mixed in the composition (A) and oriented. The polymerizable liquid crystal compound is a liquid crystal compound that is capable of being polymerized in the composition (A) in a state of exhibiting the liquid crystal phase, to form a polymer in which the orientation of molecules in the liquid crystal phase is maintained. Further, the polymerizable liquid crystal compound having inverse wavelength dispersion is a polymerizable liquid crystal compound in which a polymer obtained as described above exhibits inverse wavelength dispersion.

Herein, compounds as the component of the composition (A) that have polymerizability (the polymerizable liquid crystal compound, other compounds having polymerizability, etc.) are sometimes collectively referred to as "polymerizable compound".

[1.9.1. Polymerizable Liquid Crystal Compound]

Examples of the polymerizable liquid crystal compound may include various types of discotic liquid crystal compounds and rod-like liquid crystal compounds.

Examples of the discotic liquid crystal compounds may include various types of compounds that have a discotic core and a polymerizable group, and a capability of forming a liquid crystal phase. The molecule itself of a discotic liquid crystal compound usually has optically negative uniaxiality. It is particularly preferable that the discotic liquid crystal compound is capable of exhibiting the hybrid orientation. The optically anisotropic layer that is formed by the discotic liquid crystal compounds and has the hybrid orientation is useful, for example, for improving a viewing angle characteristic of a TN liquid crystal cell. An orientation structure of the discotic liquid crystal compounds can be thermally kept stable by using the discotic liquid crystal compounds having a cross-linking group, such as an epoxy group and an acrylate group, in a side chain terminal and crosslinking the cross-linking group in a temperature range for forming a discotic nematic phase.

More specific examples of the discotic liquid crystal compounds may include the following discotic liquid crystal compounds D1 to D3.

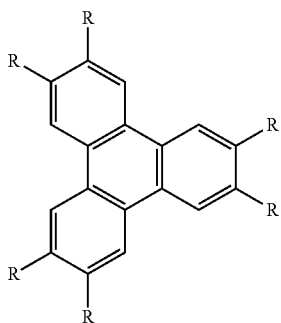

D1

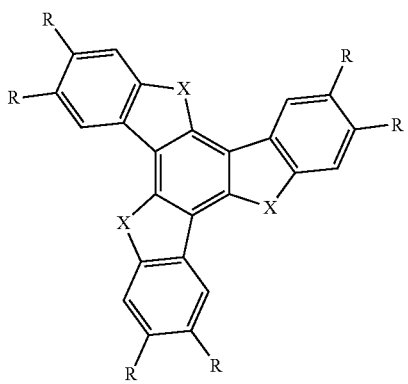

D2

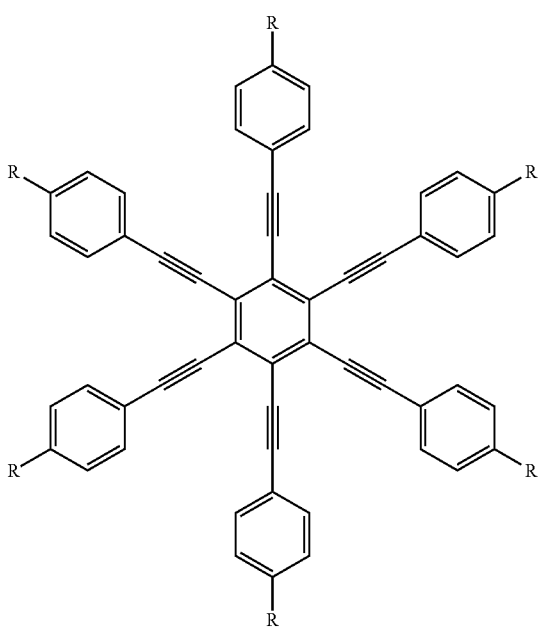

D3

Examples of the substituent R in the discotic liquid crystal compounds D1 to D3 may include —O—C(=O)—$C_nH_{2n+1}$, —O—C(=O)-Ph-O—$C_nH_{2n+1}$, —O—C(=O)—$C_nH_{2n}$—O—C(=O)—CH=$CH_2$, —O—C(=O)—$C_nH_{2n}$—O—C(=O)—C($CH_3$)=$CH_2$, —O—C(=O)—$C_nH_{2n}$—O—CH=$CH_2$, —O—C(=O)—$C_nH_{2n}H_{2n}$O—C($CH_3$)=$CH_2$, —O—C(=O)-Ph-O—$C_nH_{2n}$—O—C(=O)—CH=$CH_2$, —O—C(=O)-Ph-O—$C_nH_{2n}$—O—C(=O)—C($CH_3$)=$CH_2$, —O—C(=O)-Ph-O—$C_nH_{2n}$—O—CH=$CH_2$, and —O—C(=O)-Ph-O—$C_nH_{2n}$—O—C(=O)—C($CH_3$)=$CH_2$. Among these, —O—C(=O)—$C_nH_{2n}$—O—C(=O)—CH=$CH_2$, —O—C(=O)-Ph-O—$C_nH_{2n}$—O—C(=O)—CH=$CH_2$, and —O—C(=O)-Ph-O—$C_nH_{2n}$—O—CH=$CH_2$ are preferable and —O—C(=O)-Ph-O—$C_nH_{2n}$—O—C(=O)—CH=$CH_2$ is further preferable.

In the substituent R, n is a natural number of preferably 3 to 10, and more preferably 4 to 8. In the discotic liquid crystal compound D2, X is $CH_2$, O, S, or NH. Among these, $CH_2$ or O is preferable and $CH_2$ is further preferable.

Other specific examples of the discotic liquid crystal compounds may include those described in Japanese Patent Application Laid-Open No. Hei. 8-50206 A and documents (C. Destrade et al., Mol. Cryst. Liq. Cryst., vol. 71, page 111 (1981); Chemical Quarterly Review, No. 22, edited by the Chemical Society of Japan, Chemistry of Liquid Crystal, Chapter 5, Section 2 of Chapter 10 (1994); B. Kohne et al., Angew. Chem. Soc. Chem. Comm., page 1794 (1985); and J. Zhang et al., J. Am. Chem. Soc., vol. 116, page 2655 (1994)).

When the discotic liquid crystal compound and a compound having an aromaticity in a main chain skeleton such as an aromatic polyester, an aromatic polycarbonate, an aromatic polyimide, and an aromatic polyamide are used as the polymerizable liquid crystal compound, the resulting optically anisotropic layer can have negative uniaxiality. The negative uniaxiality of the optically anisotropic layer is a property wherein, when refractive indexes of the optically anisotropic layer in the three axis directions are represented by n1, n2, and n3 in increasing order of their values, n1, n2, and n3 satisfy a relationship of n1<n2=n3. Thus, the optically anisotropic layer having negative uniaxiality has the minimum refractive index in an optical axis direction. The values of n2 and n3 are not necessarily precisely equal to each other, and the optically anisotropic layer is considered to have negative uniaxiality when their values are approximately equal to each other. Specifically, when n1, n2 and n3 satisfy a relationship:

$$(|n2-n3|/|n2-n1|) \le 0.2,$$

the optically anisotropic layer is applicable to a practical use as a layer having negative uniaxiality. Further, for the purpose of obtaining the optically anisotropic layer capable of significantly improving a viewing angle characteristic of a twisted nematic liquid crystal cell, the optical axis may have an inclination β from a normal direction of the surface of the optically anisotropic layer of preferably 5° to 60°, more preferably 10° to 50°, and most preferably 20° to 40°. Further, the optically anisotropic layer preferably satisfies a condition of 50≤Re≤400 (nm).

Examples of the rod-like liquid crystal compounds may include those having a polymerizable group, described in Japanese Patent Application Laid-Open Nos. 2002-030042 A, 2004-204190 A, 2005-263789 A, 2007-119415 A, 2007-186430 A, and Hei. 11-513360 A. Further, preferable examples of commercially available liquid crystal compounds may include "LC242" manufactured by BASF SE. As the liquid crystal compound, one type thereof may be solely used, and two or more types thereof may also be used in combination at any ratio.

The rod-like liquid crystal compounds have refractive index anisotropy Δn of preferably 0.02 or more, and more preferably 0.05 or more, and of preferably 0.30 or less, and more preferably 0.25 or less. When the refractive index anisotropy Δn is less than 0.02, the larger thickness of the liquid crystal resin layer is required for achieving a desired optical function, thereby causing a risk of lowering orientation uniformity. This is also disadvantageous in terms of economical costs. When the refractive index anisotropy Δn is more than 0.30, the smaller thickness of the liquid crystal resin layer is required for obtaining a desired optical function, thereby causing a disadvantage in terms of thickness precision. When Δn is more than 0.30, an absorption edge on a long wavelength side of an ultraviolet absorption spectrum of the liquid crystal resin layer may possibly reach a visible region. However, such a liquid crystal resin layer is nevertheless usable unless the absorption edge of the spectrum reaching the visible region adversely affects desired optical performance. When a composition for forming the liquid crystal layer contains only one type of liquid crystal compound, the refractive index anisotropy of this liquid crystal compound itself represents the refractive index anisotropy of the liquid crystal compound of the composition for forming the liquid crystal layer. On the other hand, when a composition for forming the liquid crystal layer contains two or more types of liquid crystal compounds, the refractive index anisotropy of the liquid crystal compounds of the composition for forming the liquid crystal layer is a value of refractive index anisotropy Δn determined on the basis of values of the refractive index anisotropy Δn and content ratios of the respective liquid crystal compounds. The value of the refractive index anisotropy Δn may be measured by the Senarmont method.

As these liquid crystal compounds and a polymerizable liquid crystal compound with inverse wavelength dispersion described below, one type thereof may be solely used, and two or more types thereof may also be used in combination at any ratio.

[1.9.2. Polymerizable Liquid Crystal Compound Having Inverse Wavelength Dispersion]

As a part of or all of the polymerizable liquid crystal compound, a polymerizable liquid crystal compound having inverse wavelength dispersion may be used. When the polymerizable liquid crystal compound having inverse wavelength dispersion is used, an optically anisotropic layer having inverse wavelength dispersion can be easily obtained.

Examples of the polymerizable liquid crystal compound having inverse wavelength dispersion may include a compound having a main chain mesogen and a side chain mesogen bonded to the main chain mesogen in the molecule. In a state where the polymerizable liquid crystal compound having inverse wavelength dispersion is oriented, the side chain mesogen can be oriented in a direction different from that of the main chain mesogen. Therefore, the main chain mesogen and the side chain mesogen can be oriented in different directions in the optically anisotropic layer. By having such an orientation, the optically anisotropic layer can exhibit inverse wavelength dispersion characteristics.

[1.9.2.1. Compound (I)]

Examples of the polymerizable liquid crystal compound having inverse wavelength dispersion may include a compound represented by the following formula (I) (hereinafter sometimes referred to as "compound (I)").

When the polymerizable liquid crystal compound having inverse wavelength dispersion is the compound (I), the —$Y^5$-$A^4$-$Y^3$-$A^2$-$Y^1$-$A^1$-$Y^2$-$A^3$-$Y^4$-$A^5$-$Y^6$— group is the main chain mesogen, and the >$A^1$-C($Q^1$)=N—N($A^x$)$A^y$ group is the side chain mesogen. The $A^1$ group affects both properties of the main chain mesogen and the side chain mesogen.

In the formula, $Y^1$ to $Y^8$ are each independently a chemical single bond, —O—, —S—, —O—C(=O)—, —C(=O)—O—, —O—C(=O)—O—, —$NR^1$—C(=O)—, —C(=O)—$NR^1$—, —O—C(=O)—$NR^1$—, —$NR^1$—C(=O)—O—, —$NR^1$—C(=O)—$NR^1$—, —O—$NR^1$—, or —$NR^1$—O—.

Herein, $R^1$ is a hydrogen atom or an alkyl group having 1 to 6 carbon atoms.

Examples of the alkyl group having 1 to 6 carbon atoms of $R^1$ may include a methyl group, an ethyl group, an n-propyl group, an isopropyl group, an n-butyl group, a sec-butyl group, a t-butyl group, an n-pentyl group, and an n-hexyl group.

It is preferable that $R^1$ is a hydrogen atom or an alkyl group having 1 to 4 carbon atoms.

In the compound (I), it is preferable that $Y^1$ to $Y^8$ are each independently a chemical single bond, —O—, —O—C(=O)—, —C(=O)—O—, or —O—C(=O)—O—.

$G^1$ and $G^2$ are each independently a divalent aliphatic group optionally having a substituent and having 1 to 20 carbon atoms.

Examples of the divalent aliphatic group having 1 to 20 carbon atoms may include a divalent aliphatic group having a linear structure, such as an alkylene group having 1 to 20 carbon atoms and an alkenylene group having 2 to 20 carbon atoms; and a divalent aliphatic group, such as a cycloalkanediyl group having 3 to 20 carbon atoms, a cycloalkenediyl group having 4 to 20 carbon atoms, and a divalent alicyclic fused ring group having 10 to 30 carbon atoms.

Examples of the substituent in the divalent aliphatic group of $G^1$ and $G^2$ may include a halogen atom, such as a fluorine atom, a chlorine atom, a bromine atom, and an iodine atom; and an alkoxy group having 1 to 6 carbon atoms, such as a methoxy group, an ethoxy group, an n-propoxy group, an isopropoxy group, an n-butoxy group, a sec-butoxy group, a t-butoxy group, an n-pentyloxy group, and an n-hexyloxy group. Among these, a fluorine atom, a methoxy group, and an ethoxy group are preferable.

The aforementioned aliphatic groups may have —O—, —S—, —O—C(=O)—, —C(=O)—O—, —O—C(=O)—O—, —$NR^2$—C(=O)—, —C(=O)—$NR^2$—, —$NR^2$—, or —C(=O)— inserted into the groups, provided that cases where two or more —O— or —S— groups are adjacently inserted are excluded. Herein, $R^2$ is a hydrogen atom or an alkyl group having 1 to 6 carbon atoms, which are the same as those for $R^1$. It is preferable that $R^2$ is a hydrogen atom or a methyl group.

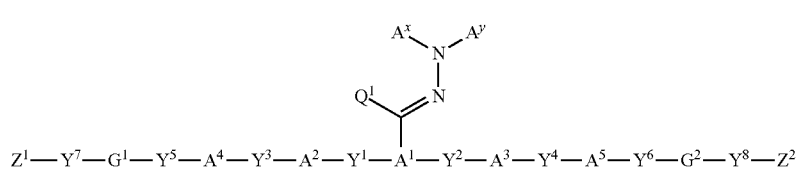

(I)

It is preferable that the group inserted into the aliphatic groups is —O—, —O—C(=O)—, —C(=O)—O—, or —C(=O)—.

Specific examples of the aliphatic groups into which any of these groups is inserted may include —CH₂—CH₂—O—CH₂—CH₂—, —CH₂—CH₂—S—CH₂—CH₂—, —CH₂—CH₂—O—C(=O)—CH₂—CH₂—, —CH₂—CH₂—C(=O)—O—CH₂—CH₂—, —CH₂—CH₂—C(=O)—O—CH₂—, —CH₂—O—C(=O)—O—CH₂—CH₂—, —CH₂—CH₂—NR²—C(=O)—CH₂—CH₂—, —CH₂—CH₂—C(=O)—NR²—CH₂—, —CH₂—NR²—CH₂—CH₂—, and —CH₂—C(=O)—CH₂—.

Among these, from the viewpoint of favorably obtaining the desired effect of the present invention, G¹ and G² are each independently preferably a divalent aliphatic group having a linear structure, such as an alkylene group having 1 to 20 carbon atoms and an alkenylene group having 2 to 20 carbon atoms, more preferably an alkylene group having 1 to 12 carbon atoms, such as a methylene group, an ethylene group, a trimethylene group, a propylene group, a tetramethylene group, a pentamethylene group, a hexamethylene group, an octamethylene group, and a decamethylene group [—(CH₂)₁₀—], and particularly preferably a tetramethylene group [—(CH₂)₄—], a hexamethylene group [—(CH₂)₆—], an octamethylene group [—(CH₂)₈—], or a decamethylene group [—(CH₂)₁₀—].

Z¹ and Z² are each independently an alkenyl group having 2 to 10 carbon atoms that is unsubstituted or substituted by a halogen atom.

It is preferable that the number of carbon atoms in the alkenyl group is 2 to 6. Examples of the halogen atom that is the substituent in the alkenyl group of Z¹ and Z² may include a fluorine atom, a chlorine atom, and a bromine atom. A chlorine atom is preferable.

Specific examples of the alkenyl group having 2 to 10 carbon atoms of Z¹ and Z² may include CH₂=CH—, CH₂=C(CH₃)—, CH₂=CH—CH₂—, CH₃—CH=CH—, CH₂=CH—CH₂—CH₂—, CH₂=C(CH₃)—CH₂—CH₂—, (CH₃)₂C=CH—CH₂—, (CH₃)₂C=CH—CH₂—CH₂—, CH₂=C(Cl)—, CH₂=C(CH₃)—CH₂—, and CH₃—CH=CH—CH₂—.

Among these, from the viewpoint of favorably obtaining the desired effect of the present invention, Z¹ and Z² are each independently preferably CH₂=CH—, CH₂=C(CH₃)—, CH₂=C(Cl)—, CH₂=CH—CH₂—, CH₂=C(CH₃)—CH₂—, or CH₂=C(CH₃)—CH₂—CH₂—, more preferably CH₂=CH—, CH₂=C(CH₃)—, or CH₂=C(Cl)—, and particularly preferably CH₂=CH—.

$A^x$ is an organic group having 2 to 30 carbon atoms and at least one aromatic ring selected from the group consisting of an aromatic hydrocarbon ring and an aromatic heterocyclic ring.

In the present invention, "aromatic ring" means a cyclic structure having aromaticity in the broad sense based on Huckel rule, that is, a cyclic conjugated structure having (4n+2) π electrons, and a structure that exhibits aromaticity by involving a lone pair of electrons in a heteroatom, such as sulfur, oxygen, and nitrogen, in a π electron system, typified by thiophene, furan, and benzothiazole.

The organic group having 2 to 30 carbon atoms and at least one aromatic ring selected from the group consisting of an aromatic hydrocarbon ring and an aromatic heterocyclic ring, of $A^x$, may have a plurality of aromatic rings, or have an aromatic hydrocarbon ring and an aromatic heterocyclic ring.

Examples of the aromatic hydrocarbon ring may include a benzene ring, a naphthalene ring, and an anthracene ring.

Examples of the aromatic heterocyclic ring may include a monocyclic aromatic heterocyclic ring, such as a pyrrole ring, a furan ring, a thiophene ring, a pyridine ring, a pyridazine ring, a pyrimidine ring, a pyrazine ring, a pyrazole ring, an imidazole ring, an oxazole ring, and a thiazole ring; and a fused aromatic heterocyclic ring, such as a benzothiazole ring, a benzoxazole ring, a quinoline ring, a phthalazine ring, a benzimidazole ring, a benzopyrazole ring, a benzofuran ring, a benzothiophene ring, a thiazolopyridine ring, an oxazolopyridine ring, a thiazolopyrazine ring, an oxazolopyrazine ring, a thiazolopyridazine ring, an oxazolopyridazine ring, a thiazolopyrimidine ring, and an oxazolopyrimidine ring.

The aromatic ring that $A^x$ has may have a substituent. Examples of the substituent may include a halogen atom, such as a fluorine atom and a chlorine atom; a cyano group; an alkyl group having 1 to 6 carbon atoms, such as a methyl group, an ethyl group, and a propyl group; an alkenyl group having 2 to 6 carbon atoms, such as a vinyl group and an allyl group; a halogenated alkyl group having 1 to 6 carbon atoms, such as a trifluoromethyl group; a substituted amino group, such as a dimethylamino group; an alkoxy group having 1 to 6 carbon atoms, such as a methoxy group, an ethoxy group, and an isopropoxy group; a nitro group; an aryl group, such as a phenyl group and a naphthyl group; —C(=O)—R⁵; —C(=O)—OR⁵; and —SO₂R⁶. Herein, R⁵ is an alkyl group having 1 to 20 carbon atoms, an alkenyl group having 2 to 20 carbon atoms, or a cycloalkyl group having 3 to 12 carbon atoms, and R⁶ is an alkyl group having 1 to 20 carbon atoms, an alkenyl group having 2 to 20 carbon atoms, a phenyl group, or a 4-methylphenyl group, which are the same as those for R⁴ described below.

The aromatic ring that $A^x$ has may have a plurality of substituents that may be the same or different, and two adjacent substituents may be bonded together to form a ring. The formed ring may be a monocycle or a fused polycycle, and may be an unsaturated ring or a saturated ring.

The "number of carbon atoms" in the organic group having 2 to 30 carbon atoms of $A^x$ means the total number of carbon atoms in the entire organic group which excludes carbon atoms in the substituents (the same applied to $A^y$ described below).

Examples of the organic group having 2 to 30 carbon atoms and at least one aromatic ring selected from the group consisting of an aromatic hydrocarbon ring and an aromatic heterocyclic ring, of $A^x$, may include an aromatic hydrocarbon ring group; an aromatic heterocyclic ring group; an alkyl group having 3 to 30 carbon atoms and at least one aromatic ring selected from the group consisting of an aromatic hydrocarbon ring group and an aromatic heterocyclic ring group; an alkenyl group having 4 to 30 carbon atoms and at least one aromatic ring selected from the group consisting of an aromatic hydrocarbon ring group and an aromatic heterocyclic ring group; and an alkynyl group having 4 to 30 carbon atoms and at least one aromatic ring selected from the group consisting of an aromatic hydrocarbon ring group and an aromatic heterocyclic ring group.

Preferable specific examples of $A^x$ are as follows. However, in the present invention, $A^x$ is not limited to the following examples. In the following formulae, "—" represents an atomic bonding at any position of the ring (the same applied to the following).

(1) An aromatic hydrocarbon ring group

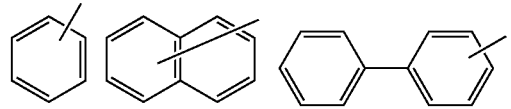

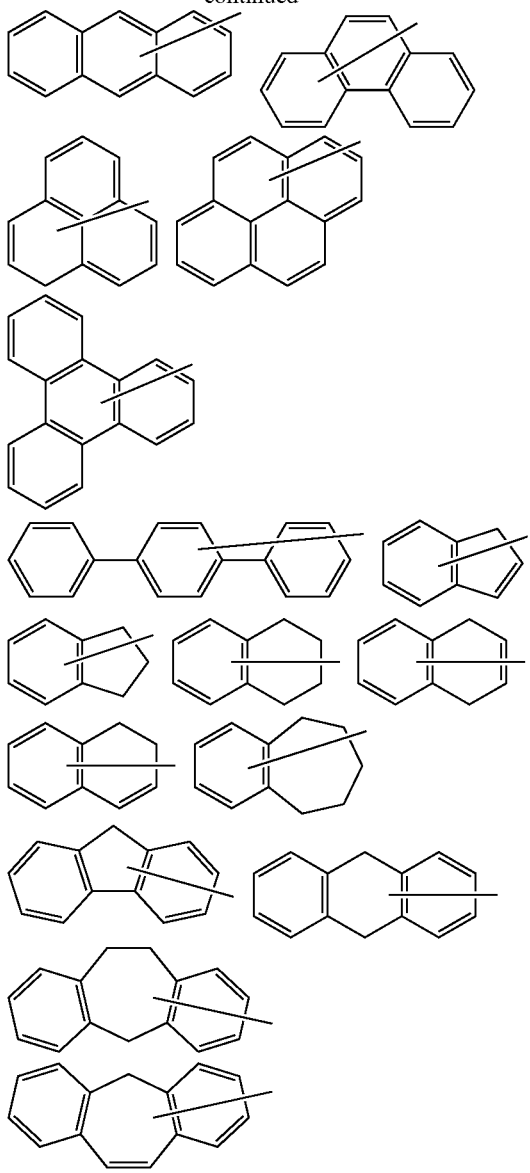

(2) An aromatic heterocyclic ring group

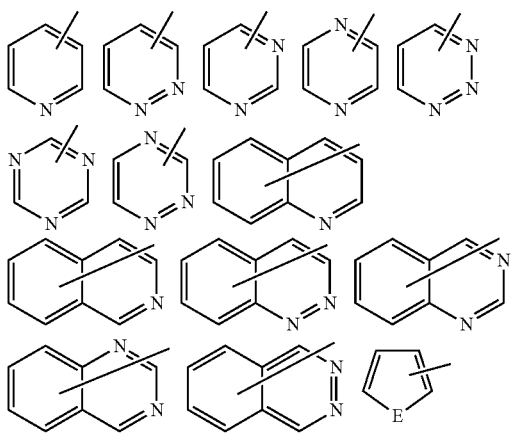

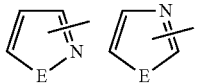

In the aforementioned formulae, E is $NR^{6a}$, an oxygen atom, or a sulfur atom. Herein, $R^{6a}$ is a hydrogen atom; or an alkyl group having 1 to 6 carbon atoms, such as a methyl group, an ethyl group, and a propyl group.

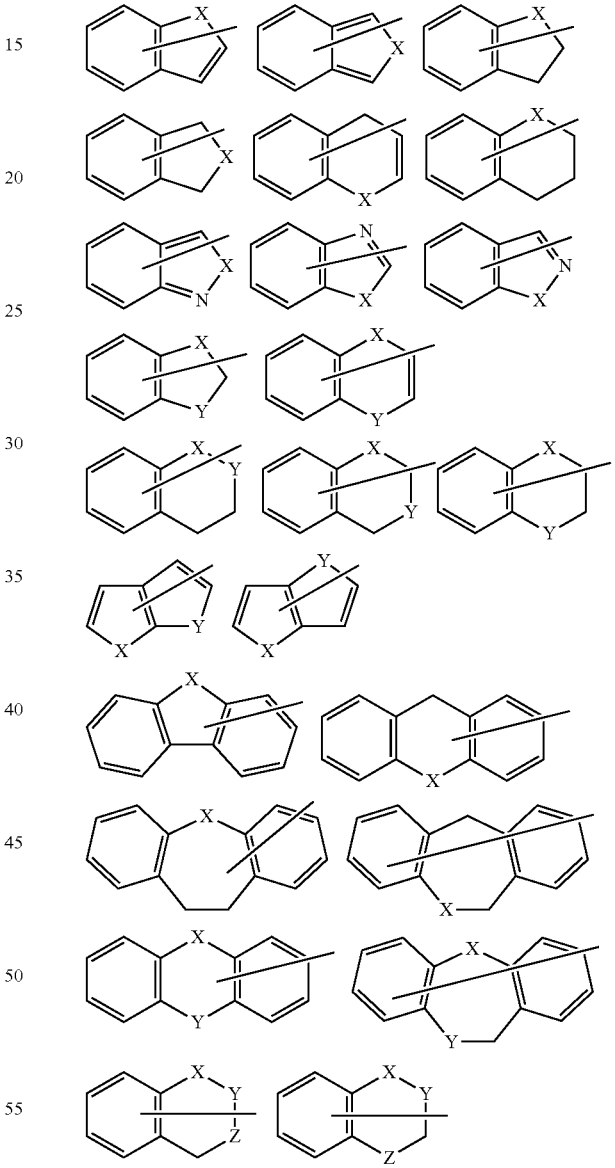

In the aforementioned formulae, X, Y, and Z are each independently $NR^7$, an oxygen atom, a sulfur atom, —SO—, or —SO$_2$— (provided that cases where an oxygen atom, a sulfur atom, —SO—, and —SO$_2$— are each adjacent are excluded). $R^7$ is a hydrogen atom; or an alkyl group having 1 to 6 carbon atoms such as a methyl group, an ethyl group, and a propyl group, which are the same as those for $R^{6a}$ described above.

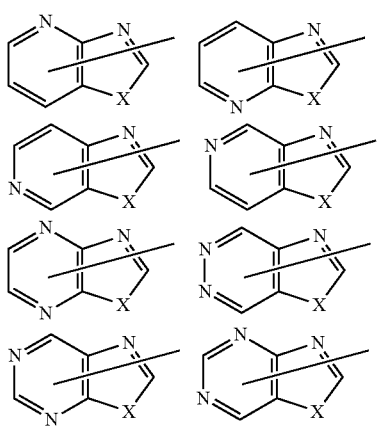

(In the aforementioned formulae, X has the same meanings as described above.)

(3) An alkyl group having at least one aromatic ring selected from the group consisting of an aromatic hydrocarbon ring group and an aromatic heterocyclic ring group

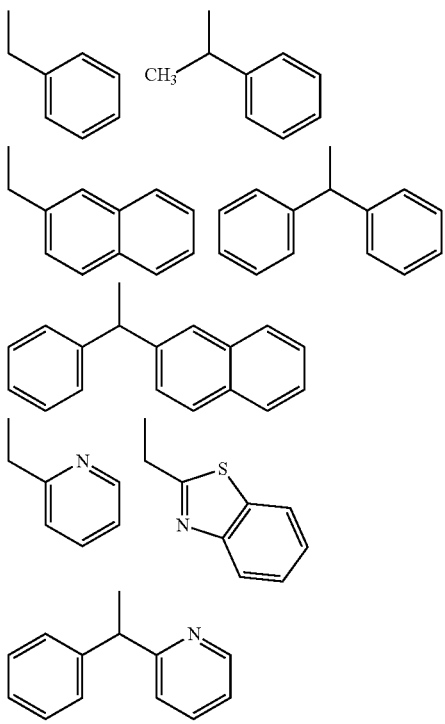

(4) An alkenyl group having at least one aromatic ring selected from the group consisting of an aromatic hydrocarbon ring group and an aromatic heterocyclic ring group

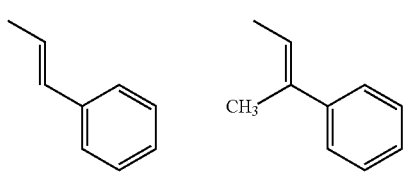

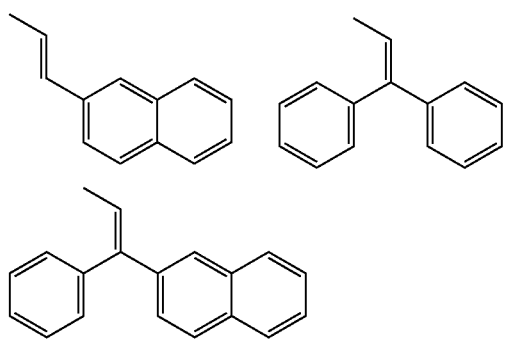

(5) An alkynyl group having at least one aromatic ring selected from the group consisting of an aromatic hydrocarbon ring group and an aromatic heterocyclic ring group

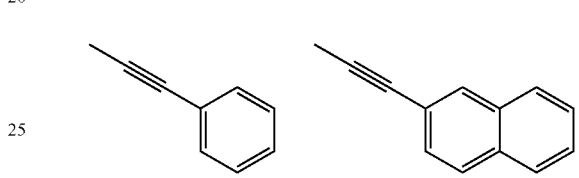

Among the groups of $A^x$, an aromatic hydrocarbon group having 6 to 30 carbon atoms and an aromatic heterocyclic ring group having 4 to 30 carbon atoms are preferable. Any groups shown below are more preferable.

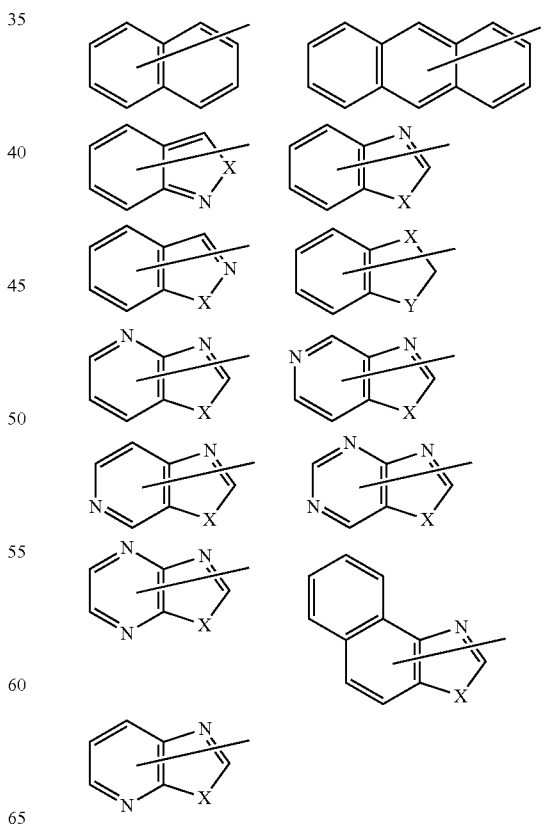

Any group shown below is further preferable.

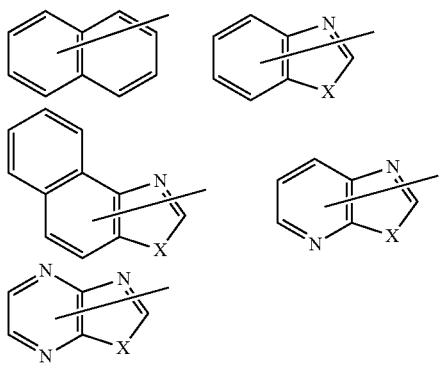

The ring that $A^x$ has may have a substituent. Examples of the substituent may include a halogen atom, such as a fluorine atom and a chlorine atom; a cyano group; an alkyl group having 1 to 6 carbon atoms, such as a methyl group, an ethyl group, and a propyl group; an alkenyl group having 2 to 6 carbon atoms, such as a vinyl group and an allyl group; a halogenated alkyl group having 1 to 6 carbon atoms, such as a trifluoromethyl group; a substituted amino group, such as a dimethylamino group; an alkoxy group having 1 to 6 carbon atoms, such as a methoxy group, an ethoxy group, and an isopropoxy group; a nitro group; an aryl group, such as a phenyl group and a naphthyl group; —C(=O)—$R^8$; —C(=O)—$OR^8$; and —$SO_2R^6$. Herein, $R^8$ is an alkyl group having 1 to 6 carbon atoms, such as a methyl group and an ethyl group; or an aryl group having 6 to 14 carbon atoms, such as a phenyl group. Among these, a halogen atom, a cyano group, an alkyl group having 1 to 6 carbon atoms, and an alkoxy group having 1 to 6 carbon atoms are preferable.

The ring that $A^x$ has may have a plurality of substituents that may be the same or different, and two adjacent substituents may be bonded together to form a ring. The formed ring may be a monocycle or a fused polycycle.

The "number of carbon atoms" in the organic group having 2 to 30 carbon atoms of $A^x$ means the total number of carbon atoms in the entire organic group which excludes carbon atoms in the substituents (the same applied to $A^y$ described below).

$A^y$ is a hydrogen atom, an alkyl group having 1 to 20 carbon atoms and optionally having a substituent, an alkenyl group having 2 to 20 carbon atoms and optionally having a substituent, a cycloalkyl group having 3 to 12 carbon atoms and optionally having a substituent, an alkynyl group having 2 to 20 carbon atoms and optionally having a substituent, —C(=O)—$R^3$, —$SO_2$—$R^4$, —C(=S)NH—$R^9$, or an organic group having 2 to 30 carbon atoms and at least one aromatic ring selected from the group consisting of an aromatic hydrocarbon ring and an aromatic heterocyclic ring. Herein, $R^3$ is an alkyl group having 1 to 20 carbon atoms and optionally having a substituent, an alkenyl group having 2 to 20 carbon atoms and optionally having a substituent, a cycloalkyl group having 3 to 12 carbon atoms and optionally having a substituent, or an aromatic hydrocarbon group having 5 to 12 carbon atoms; $R^4$ is an alkyl group having 1 to 20 carbon atoms, an alkenyl group having 2 to 20 carbon atoms, a phenyl group, or a 4-methylphenyl group; and $R^9$ is an alkyl group having 1 to 20 carbon atoms and optionally having a substituent, an alkenyl group having 2 to 20 carbon atoms and optionally having a substituent, a cycloalkyl group having 3 to 12 carbon atoms and optionally having a substituent, or an aromatic group having 5 to 20 carbon atoms and optionally having a substituent.

Examples of the alkyl group having 1 to 20 carbon atoms in the alkyl group having 1 to 20 carbon atoms and optionally having a substituent of AY may include a methyl group, an ethyl group, an n-propyl group, an isopropyl group, an n-butyl group, an isobutyl group, a 1-methylpentyl group, a 1-ethylpentyl group, a sec-butyl group, a t-butyl group, an n-pentyl group, an isopentyl group, a neopentyl group, an n-hexyl group, an isohexyl group, an n-heptyl group, an n-octyl group, an n-nonyl group, an n-decyl group, an n-undecyl group, an n-dodecyl group, an n-tridecyl group, an n-tetradecyl group, an n-pentadecyl group, an n-hexadecyl group, an n-heptadecyl group, an n-octadecyl group, an n-nonadecyl group, and an n-icosyl group. The number of carbon atoms in the alkyl group having 1 to 20 carbon atoms and optionally having a substituent is preferably 1 to 12, and further preferably 4 to 10.

Examples of the alkenyl group having 2 to 20 carbon atoms in the alkenyl group having 2 to 20 carbon atoms and optionally having a substituent of $A^y$ may include a vinyl group, a propenyl group, an isopropenyl group, a butenyl group, an isobutenyl group, a pentenyl group, a hexenyl group, a heptenyl group, an octenyl group, a decenyl group, an undecenyl group, a dodecenyl group, a tridecenyl group, a tetradecenyl group, a pentadecenyl group, a hexadecenyl group, a heptadecenyl group, an octadecenyl group, a nonadecenyl group, and an icocenyl group.

The number of carbon atoms in the alkenyl group having 2 to 20 carbon atoms and optionally having a substituent is preferably 2 to 12.

Examples of the cycloalkyl group having 3 to 12 carbon atoms in the cycloalkyl group having 3 to 12 carbon atoms and optionally having a substituent of $A^y$ may include a cyclopropyl group, a cyclobutyl group, a cyclopentyl group, a cyclohexyl group, and a cyclooctyl group.

Examples of the alkynyl group having 2 to 20 carbon atoms in the alkynyl group having 2 to 20 carbon atoms and optionally having a substituent of $A^y$ may include an ethynyl group, a propynyl group, a 2-propynyl group (propargyl group), a butynyl group, a 2-butynyl group, a 3-butynyl group, a pentynyl group, a 2-pentynyl group, a hexynyl group, a 5-hexynyl group, a heptynyl group, an octynyl group, a 2-octynyl group, a nonanyl group, a decanyl group, and a 7-decanyl group.

Examples of the substituents in the alkyl group having 1 to 20 carbon atoms and optionally having a substituent and the alkenyl group having 2 to 20 carbon atoms and optionally having a substituent, of $A^y$, may include a halogen atom, such as a fluorine atom and a chlorine atom; a cyano group; a substituted amino group, such as a dimethylamino group; an alkoxy group having 1 to 20 carbon atoms, such as a methoxy group, an ethoxy group, an isopropyl group, and a butoxy group; an alkoxy group having 1 to 12 carbon atoms that is substituted by an alkoxy group having 1 to 12 carbon atoms, such as a methoxymethoxy group and a methoxyethoxy group; a nitro group; an aryl group, such as a phenyl group and a naphthyl group; a cycloalkyl group having 3 to 8 carbon atoms, such as a cyclopropyl group, a cyclopentyl group, and a cyclohexyl group; a cycloalkyloxy group having 3 to 8 carbon atoms, such as a cyclopentyloxy group and a cyclohexyloxy group; a cyclic ether group having 2 to 12 carbon atoms, such as a tetrahydrofuranyl group, a tetrahydropyranyl group, a dioxolanyl group, and a dioxanyl group; an aryloxy group having 6 to 14 carbon atoms, such as a phenoxy group and a naphthoxy group; a fluoroalkoxy group having 1 to 12 carbon atoms in which at least one is substituted by a fluoro atom, such as a trifluoromethyl group, a pentafluoroethyl group, and —CH$_2$CF$_3$; a benzofuryl group; a benzopyranyl group; a benzodioxolyl group; a benzodioxanyl group; —C(=O)—R$^{7a}$; —C(=O)—OR$^{7a}$; —SO$_2$R$^{8a}$; —SR$^{10}$; an alkoxy group having 1 to 12 carbon atoms that is substituted by —SR$^{10}$; and a hydroxyl group. Herein, R$^{7a}$ and R$^{10}$ are each independently an alkyl group having 1 to 20 carbon atoms, an alkenyl group having 2 to 20 carbon atoms, a cycloalkyl group having 3 to 12 carbon atoms, or an aromatic hydrocarbon group having 6 to 12 carbon atoms, and R$^{8a}$ is an alkyl group having 1 to 20 carbon atoms, an alkenyl group having 2 to 20 carbon atoms, a phenyl group, or a 4-methylphenyl group, which are the same as those for R$^4$ described above.

Examples of the substituent in the cycloalkyl group having 3 to 12 carbon atoms and optionally having a substituent of A$^y$ may include a halogen atom, such as a fluorine atom and a chlorine atom; a cyano group; a substituted amino group, such as a dimethylamino group; an alkyl group having 1 to 6 carbon atoms, such as a methyl group, an ethyl group, and a propyl group; an alkoxy group having 1 to 6 carbon atoms, such as a methoxy group, an ethoxy group, and an isopropoxy group; a nitro group; an aryl group, such as a phenyl group and a naphthyl group; a cycloalkyl group having 3 to 8 carbon atoms, such as a cyclopropyl group, a cyclopentyl group, and a cyclohexyl group; —C(=O)—R$^{7a}$; —C(=O)—OR$^{7a}$; —SO$_2$R$^{8a}$; and a hydroxyl group. Herein, R$^{7a}$ and R$^{8a}$ have the same meanings as described above.

Examples of the substituent in the alkynyl group having 2 to 20 carbon atoms and optionally having a substituent of A$^y$ may include substituents that are the same as the substituents in the alkyl group having 1 to 20 carbon atoms and optionally having a substituent and the alkenyl group having 2 to 20 carbon atoms and optionally having a substituent.

In the group represented by —C(=O)—R$^3$ of A$^y$, R$^3$ is an alkyl group having 1 to 20 carbon atoms and optionally having a substituent, an alkenyl group having 2 to 20 carbon atoms and optionally having a substituent, a cycloalkyl group having 3 to 12 carbon atoms and optionally having a substituent, or an aromatic hydrocarbon group having 5 to 12 carbon atoms. Specific examples thereof may include those exemplified as the examples of the alkyl group having 1 to 20 carbon atoms and optionally having a substituent, the alkenyl group having 2 to 20 carbon atoms and optionally having a substituent, and the cycloalkyl group having 3 to 12 carbon atoms and optionally having a substituent, of A$^y$ described above.

In the group represented by —SO$_2$—R$^4$ of A$^y$, R$^4$ is an alkyl group having 1 to 20 carbon atoms, an alkenyl group having 2 to 20 carbon atoms, a phenyl group, or a 4-methylphenyl group.

Specific examples of the alkyl group having 1 to 20 carbon atoms and the alkenyl group having 2 to 20 carbon atoms, of R$^4$, may include those exemplified as the examples of the alkyl group having 1 to 20 carbon atoms and the alkenyl group having 2 to 20 carbon atoms, of AY described above.

Examples of the organic group having 2 to 30 carbon atoms and at least one aromatic ring selected from the group consisting of an aromatic hydrocarbon ring and an aromatic heterocyclic ring of A$^y$ may include those exemplified as the examples of A$^x$ described above.

Among these, A$^y$ is preferably a hydrogen atom, an alkyl group having 1 to 20 carbon atoms and optionally having a substituent, an alkenyl group having 2 to 20 carbon atoms and optionally having a substituent, a cycloalkyl group having 3 to 12 carbon atoms and optionally having a substituent, an alkynyl group having 2 to 20 carbon atoms and optionally having a substituent, —C(=O)—R$^3$, —SO$_2$—R$^4$, or an organic group having 2 to 30 carbon atoms and at least one aromatic ring selected from the group consisting of an aromatic hydrocarbon ring and an aromatic heterocyclic ring. A$^y$ is further preferably a hydrogen atom, an alkyl group having 1 to 20 carbon atoms and optionally having a substituent, an alkenyl group having 2 to 20 carbon atoms and optionally having a substituent, a cycloalkyl group having 3 to 12 carbon atoms and optionally having a substituent, an alkynyl group having 2 to 20 carbon atoms and optionally having a substituent, an aromatic hydrocarbon group having 6 to 12 carbon atoms and optionally having a substituent, an aromatic heterocyclic ring group having 3 to 9 carbon atoms and optionally having a substituent, or a group represented by —C(=O)—R$^3$, or —SO$_2$—R$^4$. Herein, R$^3$ and R$^4$ have the same meanings as described above.

It is preferable that substituents in the alkyl group having 1 to 20 carbon atoms and optionally having a substituent, the alkenyl group having 2 to 20 carbon atoms and optionally having a substituent, and the alkynyl group having 2 to 20 carbon atoms and optionally having a substituent, of A$^y$ are a halogen atom, a cyano group, an alkoxy group having 1 to 20 carbon atoms, an alkoxy group having 1 to 12 carbon atoms that is substituted by an alkoxy group having 1 to 12 carbon atoms, a phenyl group, a cyclohexyl group, a cyclic ether group having 2 to 12 carbon atoms, an aryloxy group having 6 to 14 carbon atoms, a hydroxyl group, a benzodioxanyl group, a phenylsulfonyl group, a 4-methylphenylsulfonyl group, a benzoyl group, or —SR$^{10}$. Herein, R$^{10}$ has the same meanings as described above.

It is preferable that substituents in the cycloalkyl group having 3 to 12 carbon atoms and optionally having a substituent, the aromatic hydrocarbon group having 6 to 12 carbon atoms and optionally having a substituent, and the aromatic heterocyclic group having 3 to 9 carbon atoms and optionally having a substituent, of A$^y$ are a fluorine atom, an alkyl group having 1 to 6 carbon atoms, an alkoxy group having 1 to 6 carbon atoms, or a cyano group.

A$^x$ and A$^y$ may form a ring together. Examples of the ring may include an unsaturated heterocyclic ring having 4 to 30 carbon atoms and optionally having a substituent and an unsaturated carbon ring having 6 to 30 carbon atoms and optionally having a substituent.

The unsaturated heterocyclic ring having 4 to 30 carbon atoms and the unsaturated carbon ring having 6 to 30 carbon atoms are not particularly restricted, and may or may not have aromaticity. Examples thereof may include rings shown below. The rings shown below are a moiety of:

in the formula (I).

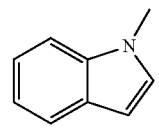 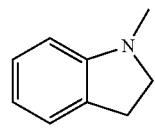

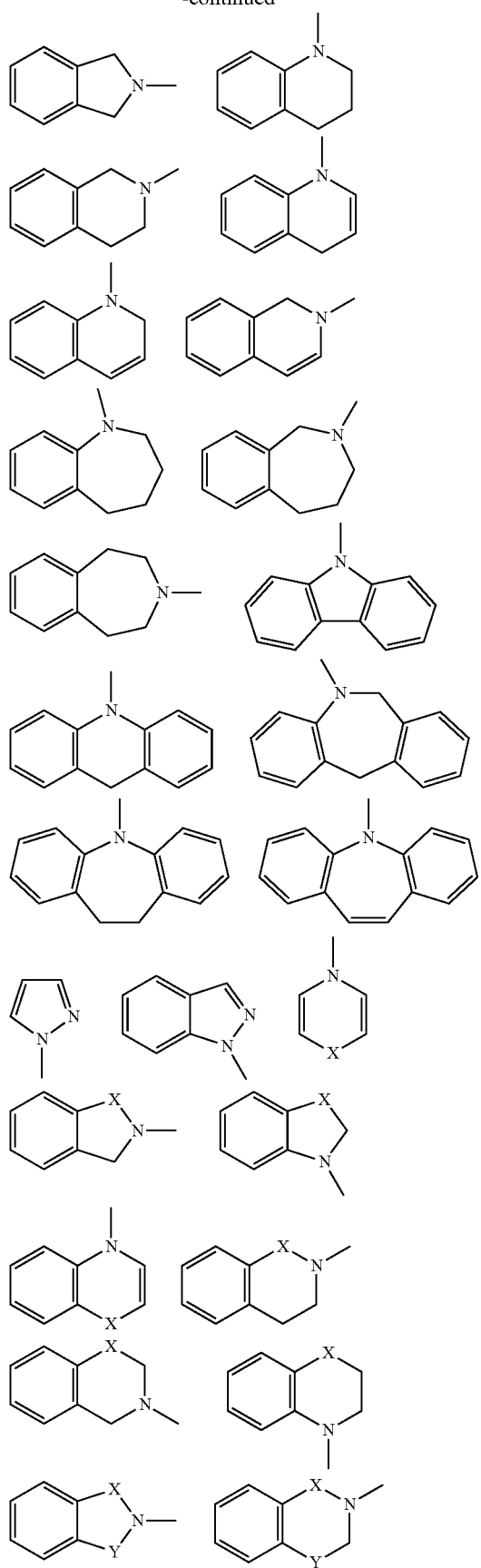
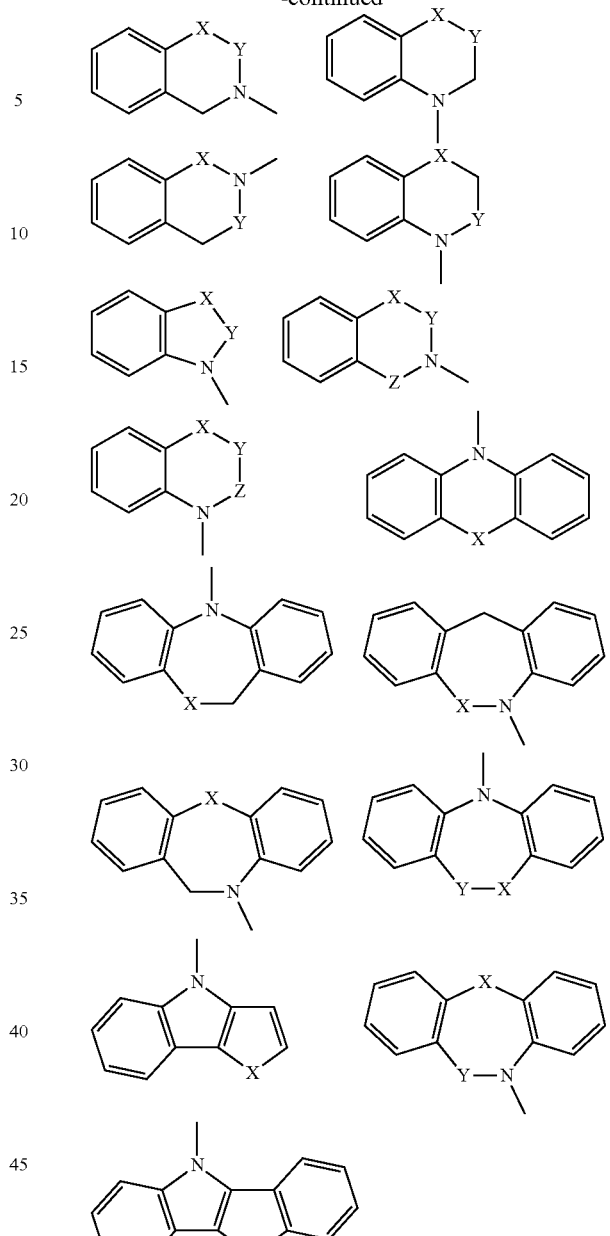

(In the formulae, X, Y, and Z have the same meanings as described above.)

The rings may have a substituent. Examples of the substituent may include those exemplified as the examples of the substituent in the aromatic ring that $A^x$ has.

The total number of π electrons contained in $A^x$ and $A^y$ is preferably 4 or more and 24 or less, more preferably 6 or more and 20 or less, and further preferably 6 or more and 18 or less from the viewpoint of favorably obtaining the desired effect of the present invention.

Examples of preferred combination of $A^x$ and $A^y$ may include:

(α) a combination of $A^x$ and $A^y$ in which $A^x$ is an aromatic hydrocarbon group having 4 to 30 carbon atoms or an aromatic heterocyclic ring group having 4 to 30 carbon atoms, $A^y$ is a hydrogen atom, a cycloalkyl group having 3 to 8 carbon atoms, an aromatic hydrocarbon group having 6 to 12 carbon atoms and optionally having a substituent (a halogen atom, a cyano group, an alkyl group having 1 to 6 carbon atoms, an alkoxy group having 1 to 6 carbon atoms, or a cycloalkyl group having 3 to 8 carbon atoms), an aromatic heterocyclic ring group having 3 to 9 carbon atoms and optionally having a substituent (a halogen atom, an alkyl group having 1 to 6 carbon atoms, an alkoxy group having 1 to 6 carbon atoms, or a cyano group), an alkyl group having 1 to 20 carbon atoms and optionally having a substituent, an alkenyl group having 1 to 20 carbon atoms and optionally having a substituent, or an alkynyl group having 2 to 20 carbon atoms and optionally having a substituent, and the substituent is any of a halogen atom, a cyano group, an alkoxy group having 1 to 20 carbon atoms, an alkoxy group having 1 to 12 carbon atoms that is substituted by an alkoxy group having 1 to 12 carbon atoms, a phenyl group, a cyclohexyl group, a cyclic ether group having 2 to 12 carbon atoms, an aryloxy group having 6 to 14 carbon atoms, a hydroxyl group, a benzodioxanyl group, a benzenesulfonyl group, a benzoyl group, and —$SR^{10}$; and (β) a combination of $A^x$ and $A^y$ in which $A^x$ and $A^y$ form an unsaturated heterocyclic ring or an unsaturated carbon ring together. Herein, $R^{10}$ has the same meanings as described above.

Examples of more preferred combination of $A^x$ and $A^y$ may include:

(γ) a combination of $A^x$ and $A^y$ in which $A^x$ is any of groups having the following structures, $A^y$ is a hydrogen atom, a cycloalkyl group having 3 to 8 carbon atoms, an aromatic hydrocarbon group having 6 to 12 carbon atoms and optionally having a substituent (a halogen atom, a cyano group, an alkyl group having 1 to 6 carbon atoms, an alkoxy group having 1 to 6 carbon atoms, or a cycloalkyl group having 3 to 8 carbon atoms), an aromatic heterocyclic ring group having 3 to 9 carbon atoms and optionally having a substituent (a halogen atom, an alkyl group having 1 to 6 carbon atoms, an alkoxy group having 1 to 6 carbon atoms, or a cyano group), an alkyl group having 1 to 20 carbon atoms and optionally having a substituent, an alkenyl group having 1 to 20 carbon atoms and optionally having a substituent, or an alkynyl group having 2 to 20 carbon atoms and optionally having a substituent, and the substituent is any of a halogen atom, a cyano group, an alkoxy group having 1 to 20 carbon atoms, an alkoxy group having 1 to 12 carbon atoms that is substituted by an alkoxy group having 1 to 12 carbon atoms, a phenyl group, a cyclohexyl group, a cyclic ether group having 2 to 12 carbon atoms, an aryloxy group having 6 to 14 carbon atoms, a hydroxyl group, a benzodioxanyl group, a benzenesulfonyl group, a benzoyl group, and —$SR^{10}$. Herein, $R^{10}$ has the same meanings as described above.

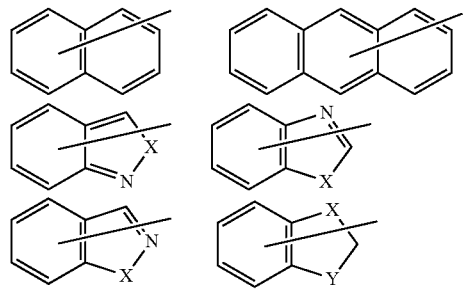

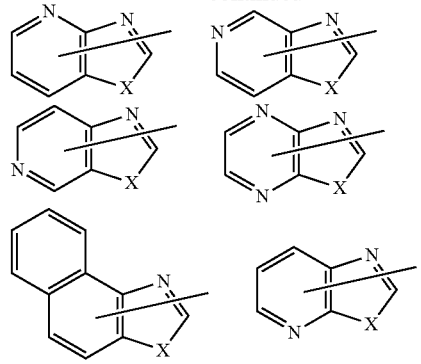

(In the formulae, X and Y have the same meanings as described above.)

Examples of particularly preferred combination of $A^x$ and $A^y$ may include:

(δ) a combination of $A^x$ and $A^y$ in which $A^x$ is any of groups having the following structures, $A^y$ is a hydrogen atom, a cycloalkyl group having 3 to 8 carbon atoms, an aromatic hydrocarbon group having 6 to 12 carbon atoms and optionally having a substituent (a halogen atom, a cyano group, an alkyl group having 1 to 6 carbon atoms, an alkoxy group having 1 to 6 carbon atoms, or a cycloalkyl group having 3 to 8 carbon atoms), an aromatic heterocyclic ring group having 3 to 9 carbon atoms and optionally having a substituent (a halogen atom, an alkyl group having 1 to 6 carbon atoms, an alkoxy group having 1 to 6 carbon atoms, or a cyano group), an alkyl group having 1 to 20 carbon atoms and optionally having a substituent, an alkenyl group having 1 to 20 carbon atoms and optionally having a substituent, or an alkynyl group having 2 to 20 carbon atoms and optionally having a substituent, and the substituent is any of a halogen atom, a cyano group, an alkoxy group having 1 to 20 carbon atoms, an alkoxy group having 1 to 12 carbon atoms that is substituted by an alkoxy group having 1 to 12 carbon atoms, a phenyl group, a cyclohexyl group, a cyclic ether group having 2 to 12 carbon atoms, an aryloxy group having 6 to 14 carbon atoms, a hydroxyl group, a benzodioxanyl group, a benzenesulfonyl group, a benzoyl group, and —$SR^{10}$. In the following formulae, X has the same meanings as described above. Herein, $R^{10}$ has the same meanings as described above.

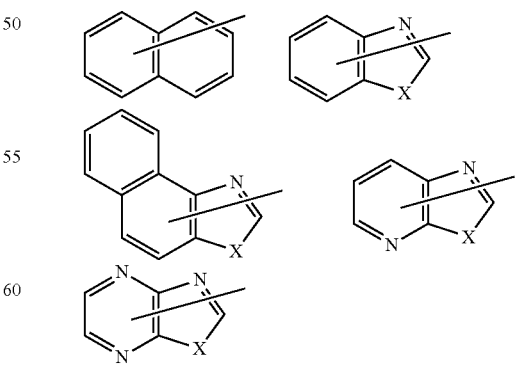

$A^1$ is a trivalent aromatic group optionally having a substituent. The trivalent aromatic group may be a trivalent carbocyclic aromatic group, and may also be a trivalent heterocyclic aromatic group. From the viewpoint of favorably obtaining the desired effect of the present invention, the trivalent aromatic group is preferably the trivalent carbocyclic aromatic group, more preferably a trivalent benzene ring group or a trivalent naphthalene ring group, and further preferably a trivalent benzene ring group or a trivalent naphthalene ring group that is represented by the following formula.

In the following formulae, substituents $Y^1$ and $Y^2$ are described for the sake of convenience to clearly show a bonding state ($Y^1$ and $Y^2$ have the same meanings as described above, and the same applied to the following).

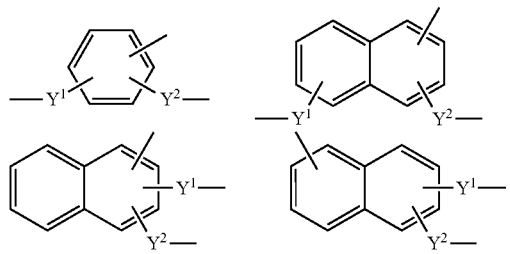

Among these, it is preferable that $A^1$ is a group represented by each of the following formulae (A11) to (A25), more preferably a group represented by the formula (A11), (A13), (A15), (A19), or (A23), and particularly preferably a group represented by the formula (A11) or (A23).

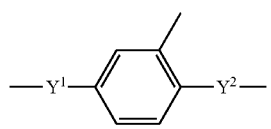
(A11)

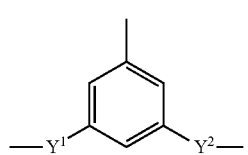
(A12)

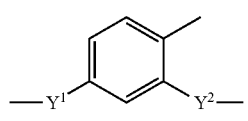
(A13)

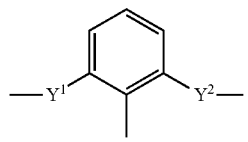
(A14)

(A15)

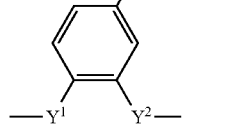
(A16)

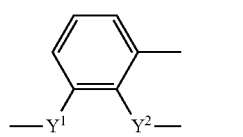

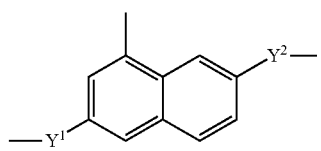
(A17)

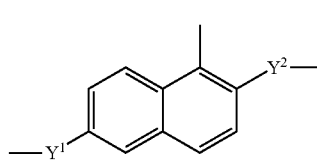
(A18)

(A19)

(A20)

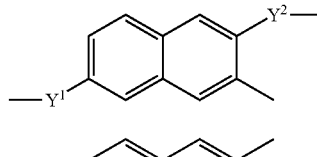
(A21)

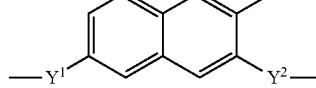

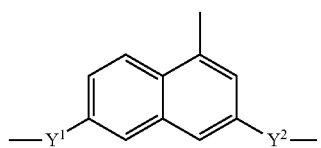
(A22)

(A23)

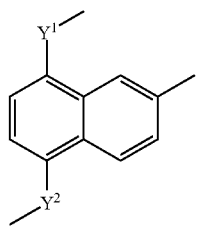

(A24)

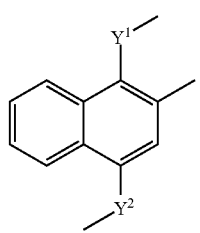

(A25)

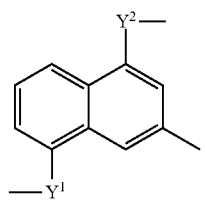

Examples of the substituent that may be included in the trivalent aromatic group of $A^1$ may include those exemplified as the examples of the substituent in the aromatic group of $A^x$ described above. It is preferable that $A^1$ is a trivalent aromatic group having no substituent.

$A^2$ and $A^3$ are each independently a divalent alicyclic hydrocarbon group having 3 to 30 carbon atoms and optionally having a substituent.

Examples of the divalent alicyclic hydrocarbon group having 3 to 30 carbon atoms may include a cycloalkanediyl group having 3 to 30 carbon atoms and a divalent alicyclic fused ring group having 10 to 30 carbon atoms.

Examples of the cycloalkanediyl group having 3 to 30 carbon atoms may include a cyclopropanediyl group; a cyclobutanediyl group, such as a cyclobutane-1,2-diyl group and a cyclobutane-1,3-diyl group; a cyclopentanediyl group, such as a cyclopentane-1,2-diyl group and a cyclopentane-1,3-diyl group; a cyclohexanediyl group, such as a cyclohexane-1,2-diyl group, a cyclohexane-1,3-diyl group, and a cyclohexane-1,4-diyl group; a cycloheptanediyl group, such as a cycloheptane-1,2-diyl group, a cycloheptane-1,3-diyl group, and a cycloheptane-1,4-diyl group; a cyclooctanediyl group, such as a cyclooctane-1,2-diyl group, a cyclooctane-1,3-diyl group, a cyclooctane-1,4-diyl group, and a cyclooctane-1,5-diyl group; a cyclodecanediyl group, such as a cyclodecane-1,2-diyl group, a cyclodecane-1,3-diyl group, a cyclodecane-1,4-diyl group, and a cyclodecane-1,5-diyl group; a cyclododecanediyl group, such as a cyclododecane-1,2-diyl group, a cyclododecane-1,3-diyl group, a cyclododecane-1,4-diyl group, and a cyclododecane-1,5-diyl group; a cyclotetradecanediyl group, such as a cyclotetradecane-1,2-diyl group, a cyclotetradecane-1,3-diyl group, a cyclotetradecane-1,4-diyl group, a cyclotetradecane-1,5-diyl group, and a cyclotetradecane-1,7-diyl group; and a cycloeicosanediyl group, such as a cycloeicosane-1,2-diyl group and a cycloeicosane-1,10-diyl group.

Examples of the divalent alicyclic fused ring group having 10 to 30 carbon atoms may include a decalindiyl group, such as a decalin-2,5-diyl group and a decalin-2,7-diyl group; an adamantanediyl group, such as an adamantane-1,2-diyl group and an adamantane-1,3-diyl group; and a bicyclo[2.2.1]heptanediyl group, such as a bicyclo[2.2.1]heptane-2,3-diyl group, a bicyclo[2.2.1]heptane-2,5-diyl group, and a bicyclo[2.2.1]heptane-2,6-diyl group.

The divalent alicyclic hydrocarbon groups may further have a substituent at any position. Examples of the substituent may include those exemplified as the examples of the substituent in the aromatic group of Ax described above.

Among these, $A^2$ and $A^3$ are preferably a divalent alicyclic hydrocarbon group having 3 to 12 carbon atoms, more preferably a cycloalkanediyl group having 3 to 12 carbon atoms, further preferably a group represented by each of the following formulae (A31) to (A34):

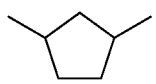

(A31)

(A32)

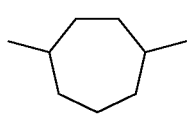

(A33)

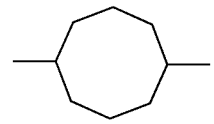

(A34)

and are particularly preferably the group represented by the aforementioned formula (A32).

The divalent alicyclic hydrocarbon group having 3 to 30 carbon atoms may exist in forms of cis- and trans-stereoisomers that are on the basis of difference of stereoconfiguration of carbon atoms bonded to $Y^1$ and $Y^3$ (or $Y^2$ and $Y^4$). For example, when the group is a cyclohexane-1,4-diyl group, a cis-isomer (A32a) and a trans-isomer (A32b) may exist, as described below.

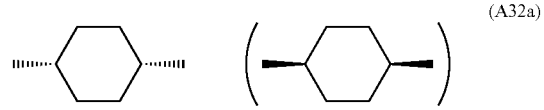

(A32a)

(A32b)

In the present invention, the group may be a cis-isomer, a trans-isomer, or an isomeric mixture of cis- and trans-isomers. The group is preferably the trans-isomer or the cis-isomer, and more preferably the trans-isomer since orientation is favorable.

$A^4$ and $A^5$ are each independently a divalent aromatic group having 6 to 30 carbon atoms and optionally having a substituent.

The aromatic group of $A^4$ and $A^5$ may be monocyclic or polycyclic.

Specific preferable examples of $A^4$ and $A^5$ are as follows.

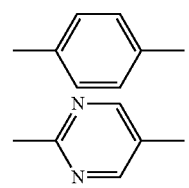 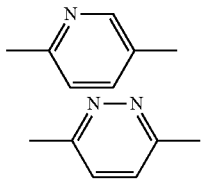

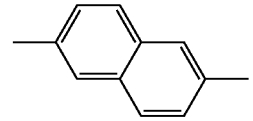 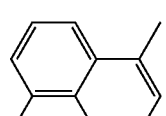

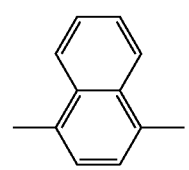

The divalent aromatic groups of $A^4$ and $A^5$ described above may have a substituent at any position. Examples of the substituent may include a halogen atom, a cyano group, a hydroxyl group, an alkyl group having 1 to 6 carbon atoms, an alkoxy group having 1 to 6 carbon atoms, a nitro group, and a —C(=O)—$OR^{8b}$ group. Herein, $R^{8b}$ is an alkyl group having 1 to 6 carbon atoms. Among these, a halogen atom, an alkyl group having 1 to 6 carbon atoms, and an alkoxy group are preferable. Of the halogen atoms, a fluorine atom is more preferable, of the alkyl groups having 1 to 6 carbon atoms, a methyl group, an ethyl group, and a propyl group are more preferable, and of the alkoxy groups, a methoxy group and an ethoxy group are more preferable.

Among these, from the viewpoint of favorably obtaining the desired effect of the present invention, $A^4$ and $A^5$ are each independently preferably a group represented by the following formula (A41), (A42), or (A43) and optionally having a substituent, and particularly preferably the group represented by the formula (A41) and optionally having a substituent.

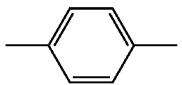
(A41)

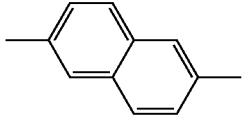
(A42)

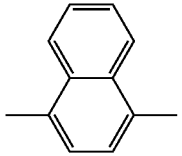
(A43)

$Q^1$ is a hydrogen atom or an alkyl group having 1 to 6 carbon atoms and optionally having a substituent.

Examples of the alkyl group having 1 to 6 carbon atoms and optionally having a substituent may include those exemplified as the examples of Ax described above.

Among these, $Q^1$ is preferably a hydrogen atom or an alkyl group having 1 to 6 carbon atoms, and more preferably a hydrogen atom or a methyl group.

The compound (I) may be produced by a reaction of a hydrazine compound with a carbonyl compound, described in, for example, International Publication No. WO2012/147904.

[1.9.3. Polymerizable Monomer]

When the composition (A) contains the polymerizable liquid crystal compound having inverse wavelength dispersion as the polymerizable liquid crystal compound, the composition (A) may contain a polymerizable monomer (a) as an optional component. Herein, the "polymerizable monomer (a)" represents, among compounds that have polymerization ability and capability to act as a monomer, in particular, the compound other than the polymerizable liquid crystal compound having inverse wavelength dispersion.

As the polymerizable monomer (a), for example, a compound having one or more polymerizable groups per one molecule may be used. When the polymerizable monomer (a) has such a polymerizable group, polymerization can be achieved in formation of the optically anisotropic layer. When the polymerizable monomer (a) is a crosslinkable monomer having two or more polymerizable groups per molecule, cross-linking polymerization can be achieved. Examples of the polymerizable groups may include groups that are the same as the groups of $Z^1$—$Y^7$— and $Z^2$—$Y^8$— in the compound (I), and an epoxy group. More specific examples thereof may include an acryloyl group, a methacryloyl group, and an epoxy group.

Examples of the polymerizable monomer (a) may include a compound represented by the general formula (M1) below.

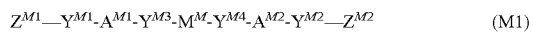
(M1)

Symbols in the formula (M1) have following meanings. $Z^{M1}$ and $Z^{M2}$ are each independently a group having a reactive group capable of causing polymerization.

$Y^{M1}$ to $Y^{M4}$ are each independently a chemical single bond, oxygen, sulfur, —O—CO—, —CO—O—, —O—CO—O—, —CO—NR$^M$—, —NR$^M$—CO—, —O—CO—NR$^M$—, —NR$^M$—CO—O—, or —NR$^M$—CO—NR$^M$—. Note that at least one of $Y^{M3}$ and $Y^{M4}$ is —O—CO—O—, —O—CO—NR$^M$—, —NR$^M$—CO—O—, or —NR$^M$—CO—NR$^M$—.

$A^{M1}$ and $A^{M2}$ are each independently a spacer having 2 to 30 C-atoms. In this case, oxygen in an ether functional group, sulfur in a thioether functional group, or an imino group or a $C_1$-$C_4$ alkyl imino group existing in a non-adjacent manner may be interposed in the carbon chain of the spacer.

$M^M$ is a mesogen group of the polymerizable monomer (a). $R^M$ is a $C_1$-$C_4$ alkyl. When the polymerizable monomer (a) has two or more $R^M$'s, they may be the same as or different from each other.

Examples of $Z^{M1}$ and $Z^{M2}$ may include groups represented by the following formulas and an epoxy group.

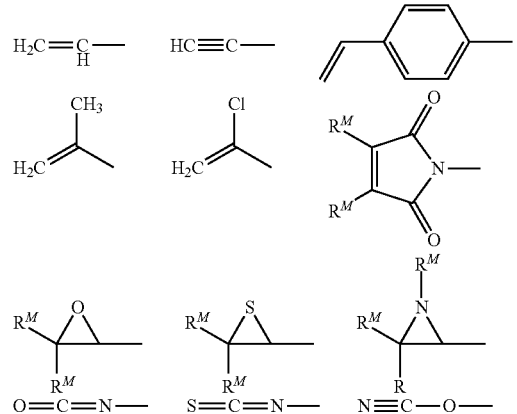

Examples of $M^M$ may include a group represented by -(-T-$Y^{5M}$-)$_r$-T-. In this formula, T is a divalent saturated or unsaturated isocyclic group or heterocyclic group, $Y^{5M}$ is $Y^{1M}$ to $Y^{4M}$, —CH$_2$—O—, —O—CH$_2$—, —CH=N—, —N=CH—, or —N=N—, and r is 0, 1, 2, or 3. When r is greater than 0, T and $Y^5$ groups may be the same as or different from each other. Specific examples of T may include groups represented by the following formulas.

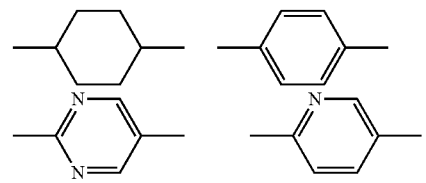

-continued

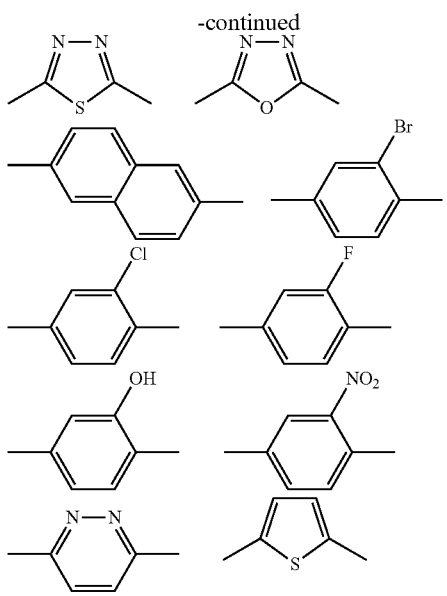

The polymerizable monomer (a) itself may have liquid crystallinity, and may also have non-liquid crystallinity. Herein, the polymerizable monomer (a) itself having "non-liquid crystallinity" means that the polymerizable monomer (a) itself that has been placed on the first substrate subjected to the orientation treatment does not exhibit orientation at any temperature from the room temperature to 200° C. Whether the polymer exhibits orientation or not is determined by the existence of the brightness-darkness contrast observed by cross-Nicol transmission using a polarizing microscope upon rotating a rubbing direction in the plane.

The content ratio of the polymerizable monomer (a) in the composition (A) is usually 1 to 100 parts by weight, and preferably 5 to 50 parts by weight, relative to 100 parts by weight of the polymerizable liquid crystal compound having inverse wavelength dispersion. By appropriately adjusting the content ratio of the polymerizable monomer (a) within the range described above so as to obtain desired inverse wavelength dispersion property, the inverse wavelength dispersion property can be easily controlled with high accuracy.

The polymerizable monomer (a) may be produced by a known production method. Alternatively, when the polymerizable monomer (a) has a similar structure to the compound (I), it may be produced in accordance with the method for producing the compound (I).

[1.9.4. Other Component In Composition (A)]

If necessary, the composition (A) may contain an optional component, such as those exemplified below, in addition to the polymerizable liquid crystal compound and the above-described optional compound (the polymerizable monomer (a), and the like).

The composition (A) may contain a polymerization initiator. The polymerization initiator may be appropriately selected depending on the types of polymerizable groups of the polymerizable liquid crystal compound, the polymerizable monomer (a), and other polymerizable compounds in the composition (A). For example, when the polymerizable group has radical polymerizability, a radical polymerization initiator may be used. When the polymerizable group is an anionic polymerizable group, an anionic polymerization initiator may be used. When the polymerizable group is a cationic polymerizable group, a cationic polymerization initiator may be used.

As the radical polymerization initiator, any of a thermal radical generator that is a compound that generates active species capable of initiating polymerization of the polymerizable compound by heating; and a photo-radical generator that is a compound that generates active species capable of initiating polymerization of the polymerizable compound by exposure to exposure light, such as visible light, ultraviolet light (i-line, etc.), far-ultraviolet light, electron beam, and X-ray may be used. The photo-radical generator is suitably used.

Examples of the photo-radical generator may include an acetophenone-based compound, a biimidazole-based compound, a triazine-based compound, an O-acyl oxime-based compound, an onium salt-based compound, a benzoin-based compound, a benzophenone-based compound, an α-diketone-based compound, a polynuclear quinone-based compound, a xanthone-based compound, a diazo-based compound, and an imide sulfonate-based compound, which are described in International Publication No. WO2012/147904.

Examples of the anionic polymerization initiator may include an alkyl lithium compound; a monolithium salt or a monosodium salt of biphenyl, naphthalene, and pyrene; and a polyfunctional initiator, such as a dilithium salt and a trilithium salt.

Examples of the cationic polymerization initiator may include a protonic acid, such as sulfuric acid, phosphoric acid, perchloric acid, and trifluoromethanesulfonic acid; a Lewis acid, such as boron trifluoride, aluminum chloride, titanium tetrachloride, and tin tetrachloride; an aromatic onium salt, and a combination of an aromatic onium salt with a reductant.

Examples of a commercially available product usable as the polymerization initiator may include a photopolymerization initiator, such as Irgacure 907 and Irgacure 379 (manufactured by BASF SE).

One type of the polymerization initiator may be used alone, or two or more types thereof may be used in combination.

The content ratio of the polymerization initiator in the composition (A) is usually 0.1 to 30 parts by weight, and preferably 0.5 to 10 parts by weight, relative to 100 parts by weight of the polymerizable compound.

The composition (A) may contain a surfactant for adjustment of the surface tension. Although the surfactant is not particularly limited, a nonionic surfactant is usually preferable. As the nonionic surfactant, a commercially available product may be used. Examples thereof may include a nonionic surfactant that is an oligomer having a molecular weight of several thousands. Specifically, as the commercially available surfactant among these surfactants, PolyFox "PF-151N", "PF-636", "PF-6320", "PF-656", "PF-6520", "PF-3320", "PF-651", or "PF-652" available from OMNOVA Solutions Inc.; FTERGENT "FTX-209F", "FTX-208G", or "FTX-204D" available from NEOS COMPANY LIMITED; or SURFLON "KH-40" or "S-420" available from Seimi Chemical Co., Ltd., may be used. As the surfactant, one type thereof may be solely used, and two or more types thereof may also be used in combination at any ratio. The content ratio of the surfactant in the composition (A) is usually 0.01 to 10 parts by weight, and preferably 0.1 to 2 parts by weight, relative to 100 parts by weight of the polymerizable compound.

The composition (A) may also include a cellulose-based polymer compound for the purpose of adjusting the surface tension and the like. In particular, when the discotic liquid crystal compound is used as the polymerizable liquid crystal compound, the composition (A) containing the cellulose-based polymer compound can exhibit an effect such as preventing cissing when it is applied. The cellulose-based polymer compound has a good compatibility with the discotic liquid crystal compound and a low tendency of disrupting the orientation state. Examples of the cellulose-based polymer compound may include cellulose acetate butyrate, cellulose acetate propylate, hydroxypropyl cellulose, methyl cellulose, and carboxymethyl cellulose. The content ratio of the cellulose-based polymer compound in the composition (A) is preferably 1 to 8%, and more preferably 1.5 to 6%, as the weight percentage with respect to the total amount of the polymerizable liquid crystal compound. When the content ratio of the cellulose-based polymer compound is set to the lower limit or more in the aforementioned range, an excellent cissing prevention effect can be obtained. When the content ratio is set to 8% or lower, an extreme reduction in orientation speed of the discotic liquid crystal compound can be prevented.

The composition (A) may contain a solvent, such as an organic solvent. Examples of the organic solvent may include ketones, such as cyclopentanone, cyclohexanone, methyl ethyl ketone, acetone, and methyl isobutyl ketone; acetic acid esters, such as butyl acetate and amyl acetate; halogenated hydrocarbons, such as chloroform, dichloromethane, and dichloroethane; ethers, such as 1,4-dioxane, cyclopentyl methyl ether, tetrahydrofuran, tetrahydropyran, 1,3-dioxolane, and 1,2-dimethoxyethane; and an aromatic hydrocarbon, such as toluene, xylene, and mesitylene. The boiling point of the solvent is preferably 60 to 250° C., and more preferably 60 to 150° C. from the viewpoint of excellent handleability. The amount of the solvent used is usually 100 to 1,000 parts by weight relative to 100 parts by weight of the polymerizable compound.

The composition (A) may further contain an optional additive, such as a metal, a metal complex, a dye, a pigment, a fluorescent material, a phosphorescent material, a leveling agent, a thixotropic agent, a gelator, a polysaccharide, an ultraviolet ray absorber, an infrared ray absorber, an antioxidant, an ion exchange resin, and a metal oxide, such as titanium oxide. The content ratio of each optional additive in the polymerizable composition of the present invention is usually 0.1 to 20 parts by weight relative to 100 parts by weight of the polymerizable compound.

The composition (A) may be usually prepared by mixing the components described above.

The composition (A) may further include a compound represented by the following formula (M5).

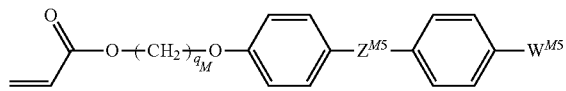

(M5)

In the formula, $W^{M5}$ is an alkyl group having 1 to 10 carbon atoms, an alkoxy group having 1 to 10 carbon atoms, a chlorine atom, a fluorine atom, —CN, or —OCF$_3$, Z is a single bond, —COO—, —OCO—, or —CH$_2$CH$_2$—, and $g_M$ is an integer of 1 to 20.

More specific examples of the compound represented by the formula (M5) may include a compound represented by the formula (M6) below.

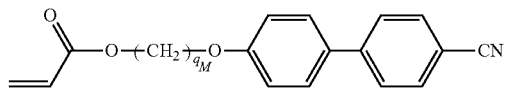

(M6)

Addition of the compound represented by the formula (M5), such as the compound represented by the formula (M6), to the composition (A) can impart, to the composition (A), features such as, for example, excellent stability in a homeotropically oriented liquid crystal phase under room temperature and orientation uniformity before and after polymerization. Thus, the excellent optically anisotropic layer can be formed using the composition (A).

The composition (A) may further include compounds constituting the polymerizable liquid crystal composition described in Japanese Patent Application Laid-Open No. 2006-307150 A. The composition (A) including these compounds can form a layer of the liquid crystal composition having an excellent stability of the homeotropically oriented liquid crystal phase.

[2. Optical Compensation Sheet, Polarizing Plate, and Liquid Crystal Display Device]

The optical compensation sheet of the present invention is obtained by separating the optically anisotropic layer from the aforementioned multilayer film of the present invention and bonding the optically anisotropic layer to a second long-length substrate.

In a preferred aspect, the optical compensation sheet includes as the optically anisotropic layer a cured product wherein the cured liquid crystal molecule is the discotic liquid crystal compound. Further, in a particularly preferred aspect, the cured product of the discotic liquid crystal compound is a cured product of the discotic liquid crystal compound having hybrid orientation. The optical compensation sheet having such an optically anisotropic layer can significantly improve a viewing angle of a liquid crystal display device such as a twisted nematic liquid crystal display device.

As one example of the second substrate, an optically isotropic substrate film may be mentioned.

Specifically, the substrate film being optically isotropic has an in-plane retardation Re of preferably less than 10 nm, and more preferably less than 5 nm. Further, the optically isotropic substrate has a retardation Rth in a thickness direction of preferably less than 10 nm, and more preferably less than 5 nm. The lower limit of the in-plane retardation Re may be 0 nm. The lower limit of the retardation Rth in a thickness direction is preferably greater than −10 nm, more preferably greater than −5 nm. The retardation Rth in a thickness direction is calculated by the following formula.

Rth=[{(nx+ny)/2}−nz] (where nx represents a refractive index in a slow axis direction in the plane of the substrate film (the in-plane maximum refractive index), ny represents a refractive index in a direction perpendicular to the slow axis in the plane of the substrate film, nz represents a refractive index in a thickness direction of the substrate film, and d represents a thickness (nm) of the substrate film.)

Examples of materials of the optically isotropic substrate film may include the same ones as exemplified for the first substrate film described above, and may also include cellulose esters. A long-length film is formed from such a material and used as the second substrate as it is without stretching. The optical compensation sheet including the optically isotropic substrate film as the second substrate as it is may be installed into an optical device, such as a display device, to be used as an optical member.

In the production of the optical compensation sheet of the present invention, the step of separating the optically anisotropic layer from the multilayer film and bonding the separated layer to the second long-length substrate may be performed by a roll-to-roll operation.

The optical compensation sheet of the present invention may be used as a component of a polarizing plate and the like. Further, such a polarizing plate may be used as a component of a liquid crystal display device. For example, the polarizing plate provided with the optical compensation sheet may be used as a polarizing plate for a twisted nematic liquid crystal display device. In such a liquid crystal display device, the optical compensation sheet may be disposed such that the display device has a layer configuration, viewed from a viewer, of polarizing plate/optical compensation sheet/liquid crystal cell/optical compensation sheet/polarizing plate.

[3. $\lambda/4$ Wave Plate]

The $\lambda/4$ wave plate of the present invention is obtained by separating the optically anisotropic layer from the aforementioned multilayer film of the present invention and bonding the optically anisotropic layer to the second long-length substrate.

In a preferred aspect, the $\lambda/4$ wave plate includes as the optically anisotropic layer a cured product wherein the cured liquid crystal molecule is the rod-like liquid crystal compound. Further, in a particularly preferred aspect, the cured product of the rod-like liquid crystal compound is a cured product of the rod-like liquid crystal compound having homogeneous orientation. More specifically, the optically anisotropic layer of the $\lambda/4$ wave plate preferably has the aforementioned optical characteristics usable as the $\lambda/4$ wave plate in terms of Re, the slow axis direction, and the like. For example, an Nz coefficient (=Rth/Re+0.5) of the $\lambda/4$ wave plate is preferably around 1.0. On the other hand, as the second substrate constituting the $\lambda/4$ wave plate, the same second substrate as used for the optical compensation sheet described above may be used.

In the production of the $\lambda/4$ wave plate of the present invention, the step of separating the optically anisotropic layer from the multilayer film and bonding the separated layer to the second long-length substrate may be performed by a roll-to-roll processing.

[4. Circularly Polarizing Plate and Organic Electroluminescent Display Device]

The circularly polarizing plate of the present invention includes the aforementioned $\lambda/4$ wave plate of the present invention.

The following are two specific preferred aspects of the circularly polarizing plate of the present invention.

Circularly polarizing plate (i): circularly polarizing plate formed by bonding the long-length $\lambda/4$ wave plate and a long-length linear polarizer.

Circularly polarizing plate (ii): circularly polarizing plate formed by bonding the long-length $\lambda/4$ wave plate, a long-length $\lambda/2$ wave plate, and a long-length linear polarizer.

As the $\lambda/2$ wave plate of the circularly polarizing plate (ii), the optically anisotropic layer of the multilayer film of the present invention, which is prepared to have optical characteristics usable as the $\lambda/2$ wave plate, may be used. Alternatively, other known $\lambda/2$ wave plates may also be used.

In the circularly polarizing plate (ii), the relationship of the slow axis of the $\lambda/4$ wave plate, the slow axis of the $\lambda/2$ wave plate, and the absorption axis or transmission axis of the linear polarizer may be set to any of various known relationships. For example, when the optically anisotropic layer of the multilayer film of the present invention is used for both the $\lambda/4$ wave plate and the $\lambda/2$ wave plate, their axis relationship may be set in such a manner that an angle of the direction of the slow axis of the $\lambda/2$ wave plate with respect to the direction of the absorption axis or transmission axis of the polarizer is 15° or an angle close to this (for example, 15°±5°, preferably 15°±4°, and more preferably 15°±3°), and an angle of the direction of the slow axis of the $\lambda/4$ wave plate with respect to the direction of the absorption axis or transmission axis of the polarizer is 75° or an angle close to this (for example, 75°±5°, preferably 75°±4°, and more preferably 75°±3°). The circularly polarizing plate having such an aspect may be used as a wide-band anti-reflection film for the organic electroluminescent display device.

In a product according to the present invention (multilayer film, circularly polarizing plate, display device, etc.), an angular relationship among the direction of the optical axes (slow axis, transmission axis, absorption axis, etc.) in the plane and the geometrical directions (long-length direction and short-length direction of film, etc.) is defined such that a shift to one direction is expressed as a positive value, while the shift to other direction is expressed as a negative value. The positive and negative directions are commonly defined in the component of the product. For example, in a circularly polarizing plate, that "the angle of the direction of the slow axis of the $\lambda/2$ wave plate with respect to the direction of the absorption axis or transmission axis of the linear polarizer is 15°, and the angle of the direction of the slow axis of the $\lambda/4$ wave plate with respect to the direction of the absorption axis or transmission axis of the linear polarizer is 75°" means the following two cases:

When the circularly polarizing plate is observed from one surface side, the direction of the slow axis of the $\lambda/2$ wave plate is shifted clockwise by 15° from the direction of the absorption axis or transmission axis of the linear polarizer, and the direction of the slow axis of the $\lambda/4$ wave plate is shifted clockwise by 75° from the direction of the absorption axis or transmission axis of the linear polarizer.

When the circularly polarizing plate is observed from one surface side, the direction of the slow axis of the $\lambda/2$ wave plate is shifted counterclockwise by 15° from the direction of the absorption axis or transmission axis of the linear polarizer, and the direction of the slow axis of the $\lambda/4$ wave plate is shifted counterclockwise by 75° from the direction of the absorption axis or transmission axis of the linear polarizer.

As a more specific aspect of the circularly polarizing plate (i), the circularly polarizing plate (i) has one layer of the $\lambda/4$ wave plate as the optically anisotropic layer and an axial relationship in which the angle of the direction of the slow axis of the $\lambda/4$ wave plate with respect to the absorption axis or transmission axis of the linear polarizer is 45° or an angle close to this (for example, 45°±5°, preferably 45°±4°, and more preferably 45°±3°). The circularly polarizing plate having such an aspect can be used as an anti-reflection film for the organic electroluminescent display device.

In the production of the circularly polarizing plate, the layers constituting the circularly polarizing plate may be bonded in a roll-to-roll manner, to thereby achieve an efficient production. The bonding in a roll-to-roll manner refers to a bonding wherein a film is unwound from a roll of a long-length film, the film is conveyed, the step of bonding the film with another film is performed on a conveyance line, and then the resulting bonded product is wound into a roll.

As the linear polarizer, a known polarizer used for devices such as a liquid crystal display device and other optical devices, may be used. Examples of the linear polarizer may include those obtained by giving a polyvinyl alcohol film an absorption treatment with iodine or dichromatic dye and then uniaxially stretching the polyvinyl alcohol film in a boric acid bath, and those obtained by giving a polyvinyl alcohol film an absorption treatment with iodine or dichromatic dye, stretching the polyvinyl alcohol film, and then modifying a part of polyvinyl alcohol units in a molecular chain into polyvinylene units. Other examples of the linear polarizer may include a polarizer having a function of separating polarized light into reflected light and transmitted light, such as a grid polarizer, a multi-layer polarizer, and a cholesteric liquid crystal polarizer. Among these, the polarizer containing polyvinyl alcohol is preferable.

When natural light is made incident on the polarizer used in the present invention, only light of one polarization is transmitted therethrough. The degree of polarization of the polarizer used in the present invention is not particularly limited, and it is preferably 98% or more, and more preferably 99% or more. The average thickness of the polarizer is preferably 5 to 80 µm.

The circularly polarizing plate of the present invention may have any other optional layer. Examples of the optional layer may include an adhesive layer for adhering with other member, a mat layer for improving the slidability of the film, a hard-coat layer such as an impact-resistant polymethacrylate resin layer, an anti-reflection layer, and an anti-fouling layer.

As one of uses of the circularly polarizing plate of the present invention, an anti-reflection film of a display device having an organic electroluminescent element may be mentioned. Specifically, the circularly polarizing plate having the aforementioned configuration may be disposed on a surface of the display device with a surface of the circularly polarizing plate on a side of the linear polarizer directed toward viewer side, whereby the emission of light, made incident from the outside of the device and reflected inside the device, to the outside of the device can be suppressed. As a result, an undesired phenomenon, such as glare of the display surface in the display device, can be suppressed. Specifically, when light is made incident from the outside of the device, only linearly polarized light constituting a portion of the light passes through the linear polarizer and is then converted into circularly polarized light by passing through the optically anisotropic layer. The circularly polarized light described herein includes elliptically polarized light within a range allowing for substantially performing an anti-reflection function. The circularly polarized light is reflected by a component that causes the reflection of light in the device (such as a reflection electrode in the organic electroluminescent element). The reflected light passes through the optically anisotropic layer again, whereby the light is converted to linearly polarized light having a polarization axis in a direction orthogonal to the polarization axis of the linearly polarized light originally made incident. The converted light thus do not pass through the linear polarizer. The anti-reflection function is achieved in this manner. In particular, the circularly polarizing plate (ii) described above can achieve the anti-reflection function in a wide band range. The circularly polarizing plate of the present invention has less defects caused by contamination of a foreign substance and the like in the optically anisotropic layer, thus enabling to exhibit the particularly excellent anti-reflection effect as described above. Further, the optically anisotropic layer in use may have three-dimensional refractive indexes (nx, ny, and nz) in a relationship of, for example, "nx>ny=nz", "nx>ny>nz", and "nx>nz>ny". The optically anisotropic layer having the three-dimensional refractive indexes in the relationship of "nx>nz>ny" can achieve the anti-reflection function not only in a front direction, but also in an oblique direction.

EXAMPLES

Hereinafter, the present invention will be specifically described with reference to Examples. However, the present invention is not limited to Examples described below. The present invention may be freely modified and practiced without departing from the scope of claims of the present invention and the scope of their equivalents.

Unless otherwise specified, "%" and "part(s)" that represent an amount in the following description are on the basis of weight. Unless otherwise specified, operations described below were performed under conditions of normal temperature and normal pressure.

[Measurement Methods]

(A) Surface Tension of First Substrate

By using Drop Master DM500 manufactured by Kyowa Interface Science Co., Ltd., the first substrates prepared in Examples and Comparative Examples were each set on a table, and a contact angle of a surface of the first substrate on a side for providing the optically anisotropic layer was measured by a sessile drop method using pure water A3 (JIS K0557) as a surface tension measuring liquid.

The surface tension of the first substrate was obtained by substituting the measured contact angle into the formula I.

$$\cos\theta = 0.0467 \cdot \gamma_s - 1.508 \quad \text{(Formula I)}$$

($\theta$: contact angle (°) of pure water, $\gamma_s$: surface tension (mN/m) of first substrate)

(B) Surface Tension of Liquid Crystal Composition

Drop Master DM500 manufactured by Kyowa Interface Science Co., Ltd. was used. Each liquid crystal composition in a solution form prepared in each of Examples and Comparative Examples was used as a surface tension measuring liquid. Measurement was performed with the surface tensiometer by a pendant drop method. The surface tension of the liquid crystal composition solution was obtained using the formula II described above.

$$\gamma_L = g \cdot \rho \cdot (de)^2 H^1 \quad \text{(Formula II)}$$

($\gamma_L$: surface tension of liquid crystal composition
g: acceleration of gravity
$\rho$: liquid density
de: maximum droplet diameter
$H^{-1}$: correction factor determined by ds/de
ds: diameter at position up by de from lower end of droplet)

[Method for Evaluating Optical Characteristics]

The optically anisotropic layers of the multilayer films obtained in Examples and Comparative Examples were each transferred and bonded to an alicyclic structure-containing polymer resin film (ZEONOR Film ZF14-050 manufactured by Optes Co., Ltd.) via an adhesive (product name "CS9621T" manufactured by Nitto Denko Corp.). In this manner, an optical compensation sheet or a λ/4 wave plate having a layer configuration of (alicyclic structure-containing polymer resin film)/(adhesive layer)/(optically anisotropic layer) was produced and evaluated as follows.

[In-Plane Retardation, Slow Axis Direction, and Orientation State]

The optical compensation sheet or the λ/4 wave plate was subjected to measurement using an AxoScan (manufactured by Axometrics, Inc.) at a measurement wavelength of 550 nm, and observed for the orientation state.

[Cross-Nicol Transmittance]

The optical compensation sheet or the λ/4 wave plate was placed between two linear polarizers (polarizer and analyzer). Directions of the aforementioned linear polarizers were set in such a manner that their polarization transmission axes became perpendicular to each other when viewed from a thickness direction. Further, the slow axis direction of the optically anisotropic layer was set in parallel with or perpendicular to the polarization transmission axes of the linear polarizers when viewed from the thickness direction. The transmittance of light transmitting through the sample (cross-Nicol transmittance at wavelength of 550 nm) was measured by using a spectrophotometer "V-7200" and an automatic polarizing film measurement device "VAP-70705", manufactured by JASCO Corp.

[Evaluation Using Liquid Crystal Display Device]

Two polarizing plates mounted in a twisted nematic liquid crystal cell (having a product of "a difference between refractive indexes of the liquid crystal to extraordinary light and to ordinary light" and "a gap size of the liquid crystal cell" of 450 nm, and a torsion angle of 90°) were separated from the liquid crystal cell. The optical compensation sheets produced using the multilayer films obtained in Examples 1 to 3 and Comparative Examples 1, 3, 4, and 6 is mounted on the separated polarizing plates. The polarizing plates and the optical compensation sheets were then mounted on the liquid crystal cell to have a configuration of polarizing plate/optical compensation sheet/liquid crystal cell/optical compensation sheet/polarizing plate from viewer side. After turning the liquid crystal cell to display a black image, the optical compensation sheets were evaluated by the following evaluation criteria. Each of the optical compensation sheets was mounted with a side of the alicyclic structure-containing polymer resin film facing the polarizing plate.

Good: an area of white light leak is less than 10% in the entire display screen.

Poor: an area of white light leak is 10% or more in the entire display screen.

[Evaluation Using Organic Electroluminescent Display Device]

A polarizing film (product name "HLC2-5618S" manufactured by Sanritz Corp., having a thickness of 180 μm and an absorption axis in a direction of 90° with respect to a short-length direction) was prepared. One side surface of the polarizing film was bonded to each of the λ/4 wave plates produced using the multilayer films obtained in Examples 4 to 6 and Comparative Examples 2, 5, and 7. The bonding was performed via an adhesive layer (product name "CS9621T" manufactured by Nitto Denko Corp.). In this manner, a circularly polarizing plate having a layer configuration of (polarizer)/(adhesive layer)/(second substrate)/(λ/4 wave plate) was obtained. In Example 7, the circularly polarizing plate obtained in the step (7-6) as it was was used.

A touch panel was removed from a commercially available organic electroluminescent display device panel with RGB colors (manufactured by SAMSUNG). The circularly polarizing plate produced as described above was disposed on a light emitting panel of the display device panel and evaluated on the black image display under a bright light field condition by the following evaluation criteria.

Good: an area of white light leak is less than 10% in the entire display screen.

Poor: an area of white light leak is 10% or more in the entire display screen.

Example 1

(1-1. Preparation of First Substrate)

A long-length alicyclic structure-containing polymer resin film (ZEONOR Film ZF14-100 manufactured by Optes Co., Ltd.) having a thickness of 100 μm and a width of 1330 mm was subjected to a corona treatment (output power of 0.2 kW, electrode width of 1600 mm, and treating rate of 20 m/min) and then supplied to a tenter stretching machine to perform diagonal stretching at a stretch temperature of 145° C. and a stretch ratio of 1.5 times. In this manner, a first substrate, which was stretched in a stretching direction of 45° (with respect to a short-length direction) and had a surface tension of 35.2 mN/m on a side on which the corona treatment was performed, was obtained.

(1-2. Preparation of Liquid Crystal Composition)

A liquid crystal composition was prepared by mixing 6 parts of cellulose acetate butyrate (product name: CAB-531-1 manufactured by Eastman Chemical Company), 100 parts of the discotic liquid crystal compound D1 (Both R's are —O—C(=O)-Ph-O—$C_4H_8$—O—C(=O)—CH=$CH_2$) synthesized by referring to Japanese Patent Application Laid-Open No. Hei. 9-95467 A, 10 parts of tripropylene glycol diacrylate (manufactured by Tokyo Chemical Industry Co., Ltd.), 2 parts of Irgacure 907 (manufactured by BASF SE) as a photopolymerization initiator, and 400 parts of methyl ethyl ketone. The surface tension of the obtained liquid crystal composition was measured and found to be 28.3 mN/m.

(1-3. Formation of Optically Anisotropic Layer)

The liquid crystal composition obtained in (1-2) was applied onto the first substrate obtained in (1-1) on a side on which the corona treatment was performed with a bar coater to form a layer of the liquid crystal composition. The resultant was placed in a heating zone at 140° C. and left in a heated state for 2 minutes, and then irradiated with ultraviolet rays at an integrated light amount of 100 mJ/$cm^2$ (irradiation intensity of 10 mW/$cm^2$ for an irradiation time of 10 seconds) or more under a nitrogen atmosphere to perform a cross-linking reaction. In this manner, an optically anisotropic layer having a film thickness of 2.0 μm was formed and a multilayer film having a layer configuration of (first substrate)/(optically anisotropic layer) was obtained.

(1-4. Evaluation)

For the optically anisotropic layer of the multilayer film thus obtained, measurement of an angle formed between the slow axis and the short-length direction, measurement of the cross-Nicol transmittance, as well as evaluation in the liquid crystal display device were performed. The results are collectively shown in Table 1. The obtained optically anisotropic layer had a hybrid orientation state in a direction of 45° with respect to the short-length direction and an in-plane retardation Re of 30 nm.

Example 2

(2-1. Preparation of First Substrate)

A long-length alicyclic structure-containing polymer resin film (ZEONOR Film ZF14-100 manufactured by Optes Co., Ltd.) having a thickness of 100 μm and a width of 1330 mm was subjected to a corona treatment (output power of 0.2 kW, electrode width of 1600 mm, and treating rate of 20 m/min). An aqueous solution containing 5 wt % polyvinyl alcohol (product name "PVA226" manufactured by KURA- RAY CO., LTD.) was applied onto the resin film on a side, on which the corona treatment was performed, with a #4 bar and dried at 120° C. for 5 minutes to form a film of the polyvinyl alcohol. In this manner, a pre-stretch substrate having a layer configuration of (polyvinyl alcohol layer)/ (alicyclic structure-containing polymer resin film) was obtained. The pre-stretch substrate was supplied to a tenter stretching machine to perform diagonal stretching at a stretch temperature of 145° C. and a stretch ratio of 1.5 times. In this manner, a first substrate that was stretched in a stretching direction of 45° (with respect to the short-length direction) and had a surface tension of 44.4 mN/m on a side of the polyvinyl alcohol layer was obtained. The thickness of the orientation film was 0.2 μm.

(2-2. Formation of Optically Anisotropic Layer)

The liquid crystal composition obtained in (1-2) in Example 1 was applied onto the first substrate obtained in (2-1) on a side of the orientation film with a bar coater to form a layer of the liquid crystal composition. The resultant was placed in a heating zone at 140° C. and left in a heated state for 2 minutes, and then subjected to an ultraviolet-ray irradiation treatment to perform a cross-linking reaction. In this manner, an optically anisotropic layer having a film thickness of 2.0 μm was formed and a multilayer film having a layer configuration of (first substrate)/(optically anisotropic layer) was obtained.

(2-3. Evaluation)

For the optically anisotropic layer of the multilayer film thus obtained, measurement of an angle formed between the slow axis and the short-length direction, measurement of the cross-Nicol transmittance, as well as evaluation in the liquid crystal display device were performed. The results are collectively shown in Table 1. The obtained optically anisotropic layer had a hybrid orientation state in a direction of 45° with respect to the short-length direction and an in-plane retardation Re of 35 nm.

Example 3

(3-1. Preparation of First Substrate)

A long-length TAC film (FUJITAC T-80) having a thickness of 80 μm and a width of 1330 mm was immersed in a warm alkaline aqueous solution (0.1M NaOH aqueous solution) of 40° C. for 4 minutes, water-washed, and dried to obtain a saponified TAC film. The film was supplied to a tenter stretching machine to perform diagonal stretching at a stretch temperature of 185° C. and a stretch ratio of 1.8 times. In this manner, a first substrate that was stretched in a stretching direction of 45° (with respect to the short-length direction) and had a surface tension of 37.4 mN/m was obtained.

(3-2. Formation of Optically Anisotropic Layer)

The liquid crystal composition obtained in (1-2) in Example 1 was applied onto one side of the first substrate obtained in (3-1) with a bar coater to form a layer of the liquid crystal composition. The resultant was placed in a heating zone at 140° C. and left in a heated state for 2 minutes, and then subjected to an ultraviolet-ray irradiation treatment to perform a cross-linking reaction. In this manner, an optically anisotropic layer having a film thickness of 2.0 μm was formed and a multilayer film having a layer configuration of (first substrate)/(optically anisotropic layer) was obtained. The obtained optically anisotropic layer had a hybrid orientation state in a direction of 45° with respect to the short-length direction.

(3-3. Evaluation)

For the optically anisotropic layer of the multilayer film thus obtained, measurement of an angle formed between the slow axis and the short-length direction, measurement of the cross-Nicol transmittance, as well as evaluation in the liquid crystal display device were performed. The results are collectively shown in Table 1. The obtained optically anisotropic layer had a hybrid orientation state in a direction of 45° with respect to the short-length direction and an in-plane retardation Re of 40 nm.

Example 4

(4-1. Preparation of Liquid Crystal Composition)

A liquid crystal composition was prepared by mixing 21.25 parts of a polymerizable liquid crystal compound having inverse wavelength dispersion represented by the formula (B1), 0.11 parts of a surfactant (product name "SURFLON S420" manufactured by AGC SEIMI CHEMICAL CO., LTD.), 0.64 parts of a polymerization initiator (product name "Irgacure 379" manufactured by BASF SE), and 78.00 parts of a solvent (cyclopentanone manufactured by ZEON Corporation). The surface tension of the obtained liquid crystal composition was measured and found to be 33.4 mN/m.

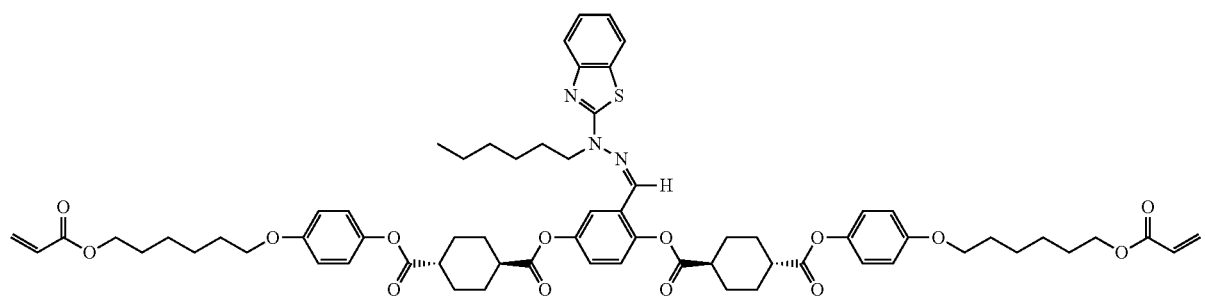

(B1)

(4-2. Formation of Optically Anisotropic Layer)

The liquid crystal composition obtained in (4-1) was applied onto the first substrate obtained in (1-1) in Example 1 on a side, on which the corona treatment was performed, with a die coater to form a layer of the liquid crystal composition. The resultant was subjected to an orientation treatment at 110° C. for 2.5 minutes. Subsequently, the layer of the liquid crystal composition was irradiated with ultraviolet rays at an integrated light amount of 100 mJ/cm² (irradiation intensity of 10 mW/cm² for irradiation time of 10 seconds) or more under a nitrogen atmosphere to polymerize the polymerizable liquid crystal compounds in the liquid crystal composition, thereby forming cured liquid crystal molecules. In this manner, an optically anisotropic manufactured by BASF SE), and 75.00 parts of a solvent (methyl ethyl ketone). The surface tension of the obtained liquid crystal composition was measured and found to be 19.0 mN/m.

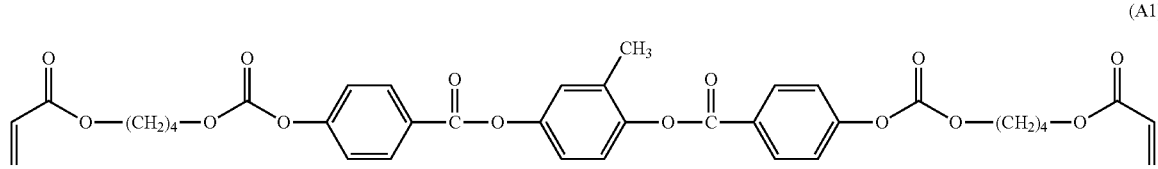

(A1)

layer having a dried film thickness of 2.3 μm was obtained and a multilayer film having a layer configuration of (first substrate)/(optically anisotropic layer) was obtained.

(4-3. Evaluation)

For the optically anisotropic layer of the multilayer film thus obtained, measurement of an angle formed between the slow axis and the short-length direction, measurement of the cross-Nicol transmittance, as well as evaluation in the OLED were performed. The results are collectively shown in Table 1. The obtained optically anisotropic layer had a homogeneous orientation state in a direction of 45° with respect to the short-length direction and an in-plane retardation Re of 145 nm.

Examples 5 and 6

Multilayer films were obtained and evaluated in the same manner as in Example 4 except that, as the first substrate, the one obtained in (2-1) in Example 2 (Example 5) or the one obtained (3-1) in Example 3 (Example 6) was used in place of the one obtained in (1-1) in Example 1. The side of the first substrate where the liquid crystal composition was applied was the same as in Examples 2 and 3. The results are collectively shown in Table 1. The obtained optically anisotropic layers had a homogeneous orientation state in a direction of 45° with respect to the short-length direction in both Examples 5 and 6, and an in-plane retardations Re of 143 nm (Example 5) and 145 nm (Example 6).

Example 7

(7-1. Preparation of First Substrate (75))

A first substrate (75), which was stretched in a direction of 75° (with respect to the short-length direction) and had a surface tension of 44.4 mN/m, was obtained in the same manner as in (2-1) in Example 2 except that the stretching direction was changed and the stretch ratio was changed to 2.5 times.

(7-2. Preparation of First Substrate (15))

A first substrate, which was stretched in a direction of 15° (with respect to the short-length direction) and had a surface tension of 44.4 mN/m, was obtained in the same manner as in (2-1) in Example 2 except that the stretching direction was changed.

(7-3. Preparation of Liquid Crystal Composition)

A liquid crystal composition was prepared by mixing 24.15 parts of a polymerizable liquid crystal compound (product name "LC242" manufactured by BASF SE, the compound represented by the formula (A1)), 0.12 parts of a surfactant (product name "FTERGENT FTX-209F" manufactured by NEOS CO., LTD.), 0.73 parts by weight of a polymerization initiator (product name "Irgacure 379"

(7-4. Preparation of Multilayer Film (75))

The liquid crystal composition obtained in (7-3) was applied onto the first substrate (75) obtained in (7-1) on a side of the orientation film with a bar coater to form a layer of the liquid crystal composition. The layer of the liquid crystal composition formed on the orientation film exhibited unevenness caused by little cissing. The resultant was subjected to the orientation treatment at 110° C. for 2.5 minutes. Subsequently, the layer of the liquid crystal composition was irradiated with ultraviolet rays at an integrated light amount of 100 mJ/cm$^2$ (irradiation intensity of 10 mW/cm$^2$ for irradiation time of 10 seconds) or more under a nitrogen atmosphere to polymerize the polymerizable liquid crystal compounds in the liquid crystal composition, thereby forming cured liquid crystal molecules. In this manner, an optically anisotropic layer having a dried film thickness of 4.5 μm was obtained and a multilayer film (75) having a layer configuration of (first substrate)/(optically anisotropic layer) was obtained.

(7-5. Preparation of Multilayer Film (15))

The liquid crystal composition obtained in (7-3) was applied onto the first substrate (15) obtained in (7-2) on a side of the orientation film with a bar coater to form a layer of the liquid crystal composition. The layer of the liquid crystal composition formed on the orientation film exhibited unevenness caused by little cissing. The resultant was subjected to the orientation treatment at 110° C. for 2.5 minutes. Subsequently, the layer of the liquid crystal composition was irradiated with ultraviolet rays at an integrated light amount of 100 mJ/cm$^2$ (irradiation intensity of 10 mW/cm$^2$ for irradiation time of 10 seconds) or more under a nitrogen atmosphere to polymerize the polymerizable liquid crystal compounds in the liquid crystal composition, thereby forming cured liquid crystal molecules. In this manner, an optically anisotropic layer having a dried film thickness of 2.1 μm and the homogeneous orientation was obtained, and a multilayer film (15) having a layer configuration of (first substrate)/(optically anisotropic layer) was obtained.

(7-6. Circularly Polarizing Plate)

A circularly polarizing plate was produced by using the optically anisotropic layer of the multilayer film (75) obtained in (7-4) as the λ/2 wave plate and the optically anisotropic layer of the multilayer film (15) obtained in (7-5) as the λ/4 wave plate.

First, a polarizing film (product name "HLC2-5618S" manufactured by Sanritz Corp., having a thickness of 180 μm and an absorption axis in a direction of 90° with respect to a short-length direction) was prepared as a long-length linear polarizer. One side of the polarizing film was bonded to the multilayer film (75) at a side of the optically anisotropic layer (i.e., λ/2 wave plate). The bonding was performed via an adhesive layer (product name "CS9621T"

manufactured by Nitto Denko Corp.). In this manner, a layered body (7-*i*) having a layer configuration of (polarizer)/(adhesive layer)/(λ/2 wave plate)/(first substrate) was obtained.

Subsequently, the first substrate was separated from the layered body (7-*i*) to obtain a layered body (7-*ii*) having a layer configuration of (polarizer)/(adhesive layer)/(λ/2 wave plate).

Subsequently, the layered body (7-*ii*) at a side of the λ/2 wave plate was bonded to the multilayer film (15) at a side of the optically anisotropic layer (i.e., λ/4 wave plate). The bonding was performed via an adhesive layer (product name "CS9621T" manufactured by Nitto Denko Corp.). In this manner, a layered body (7-*iii*) having a layer configuration of (polarizer)/(adhesive layer)/(λ/2 wave plate)/(adhesive layer)/(λ/4 wave plate)/(first substrate) was obtained.

Subsequently, the first substrate was separated from the layered body (7-*iii*) to obtain a circularly polarizing plate having a layer configuration of (polarizer)/(adhesive layer)/ (λ/2 wave plate)/(adhesive layer)/(λ/4 wave plate).

The operations of the bonding and separating were continuously performed by a roll-to-roll operation. Thus, all of the operations of the bonding were performed with the long-length films being aligned with each other in their long-length directions.

Figure 3:
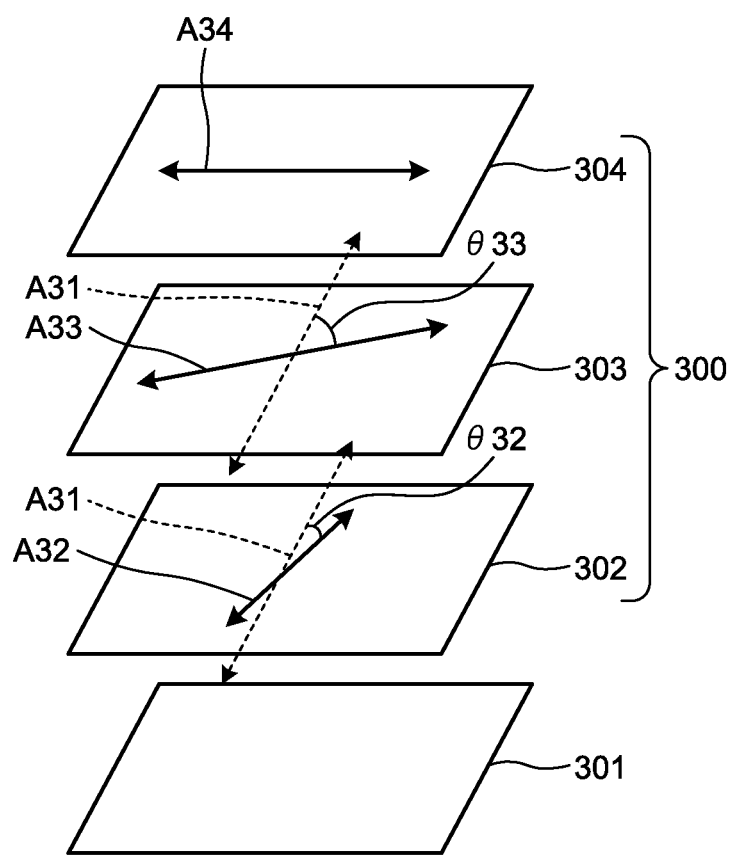
FIG. 3 is an exploded perspective view of components of a circularly polarizing plate of Example 7.

Optical axes of the components of the obtained circularly polarizing plate had an angle relationship as shown in FIG. 3. Specifically, when the circularly polarizing plate 300 was observed from a side of the polarizer 304, an absorption axis A34 of the polarizing plate formed an angle of 90° with a short-length direction A31. A slow axis A33 of the λ/2 wave plate 303 was shifted clockwise by $\theta_{33}=75°$ from the short-length direction A31, and a slow axis A32 of the λ/4 wave plate 302 was shifted clockwise by $\theta_{32}=15°$ from the short-length direction A31.

(7-7. Evaluation)

For the optically anisotropic layers of the multilayer film (75) and the multilayer film (15) thus obtained, measurement of an angle formed between the slow axis and the short-length direction, and measurement of the cross-Nicol transmittance were performed. The results are collectively shown in Table 1. The optically anisotropic layer of the multilayer film (75) had a homogeneous orientation state in a direction of 75° with respect to the short-length direction and the optically anisotropic layer of the multilayer film (15) had a homogeneous orientation state in a direction of 15° with respect to the short-length direction. Both optically anisotropic layers of the multilayer film (75) and the multilayer film (15) exhibited unevenness caused by little cissing, however this did not cause any problems in a practical use. The optically anisotropic layer of the multilayer film (75) had an in-plane retardation Re of 275 nm. The optically anisotropic layer of the multilayer film (15) had an in-plane retardation Re of 143 nm.

Further, the circularly polarizing plate obtained in (7-6) was evaluated in the OLED. In the evaluation, as shown in FIG. 3, the circularly polarizing plate 300 was placed on a light emitting panel 301 in such a manner that the polarizing plate 304 was on a light exiting surface.

The results are collectively shown in Table 1.

Example 8

(8-1. Preparation of First Substrate)

The first substrate was obtained in the same manner as in Example 1.

(8-2. Preparation of Liquid Crystal Composition)

A liquid crystal composition was prepared by mixing 68 parts of the polymerizable liquid crystal compound (the same compound as used in Example 7, represented by the formula (A1)), 29 parts of the compound represented by the formula (C1), 3 parts of Irgacure 184 (manufactured by BASF SE) as a photopolymerization initiator, and 400 parts of methyl ethyl ketone. The surface tension of the obtained liquid crystal composition was measured and found to be 25 mN/m.

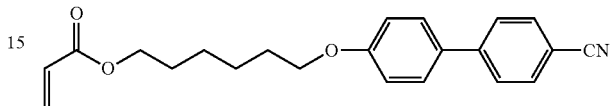

(C1)

(8-3. Formation of Optically Anisotropic Layer)

The liquid crystal composition obtained in (8-2) was applied onto the first substrate obtained in (8-1) on the side, on which the corona treatment was performed, with a bar coater to form a layer of the liquid crystal composition. The resultant was placed in a heating zone at 80° C. and left in a heated state for 2 minutes, and then irradiated with ultraviolet rays at an integrated light amount of 100 mJ/cm$^2$ (irradiation intensity of 10 mW/cm$^2$ for irradiation time of 10 seconds) or more under a nitrogen atmosphere to perform a cross-linking reaction. In this manner, an optically anisotropic layer having a film thickness of 2.0 µm was formed and a multilayer film having a layer configuration of (first substrate)/(optically anisotropic layer) was obtained.

(8-4. Evaluation)

For the optically anisotropic layer of the multilayer film thus obtained, measurement of an angle formed between the slow axis and the short-length direction, measurement of the cross-Nicol transmittance, as well as evaluation in the liquid crystal display device were performed. The results are collectively shown in Table 1. The obtained optically anisotropic layer had a hybrid orientation state in a direction of 45° with respect to the short-length direction and an in-plane retardation Re of 28 nm.

Comparative Examples 1 and 2

Multilayer films were obtained and evaluated in the same manner as in Example 1 (Comparative example 1) and in Example 4 (Comparative example 2) except that, in the preparation of the first substrate in (1-1), the corona treatment was not performed. The surface tension of the first substrate without the corona treatment was 34.0 mN/m. The results are collectively shown in Table 2. The optically anisotropic layer obtained in Comparative Example 1 was in a state of no orientation, while the optically anisotropic layer obtained in Comparative Example 2 had a homogeneous orientation state in a direction of 45° with respect to the short-length direction and an in-plane retardation Re of 139 nm.

Comparative Example 3

A multilayer film was obtained and evaluated in the same manner as in Example 2 except that, in the preparation of the first substrate in (2-1), the polyvinyl alcohol was changed to another polyvinyl alcohol (product name "Gohsefimer Z-200" manufactured by Nippon Synthetic Chemical Industry Co., Ltd.). The first substrate had a surface tension of 50.2 mN/m on a side of the orientation film. The results are collectively shown in Table 2. The obtained optically anisotropic layer had a hybrid orientation state in a direction of about 45° with respect to the short-length direction. However, the optically anisotropic layer had whitening on the film surface and had poor orientation property where the orientation directions were made nonuniform. The optically anisotropic layer had an in-plane retardation Re of 50 nm.

Comparative Examples 4 and 5

(C4-1. Preparation of First Substrate)

A long-length alicyclic structure-containing polymer resin film (ZEONOR Film ZF14-100 manufactured by Optes Co., Ltd.) having a thickness of 100 μm and a width of 1330 mm was subjected to a rubbing treatment in a direction of 45° with respect to the short-length direction (without performing the corona treatment and the stretching treatment). In this manner, a first substrate having a surface tension of 31.7 mN/m on a side on which the rubbing treatment was performed was obtained.

(C4-2. Formation and Evaluation of Optically Anisotropic Layer)

Multilayer films were obtained and evaluated in the same manner as in Example 1 (Comparative Example 4) and in Example 4 (Comparative Example 5) except that the first substrate obtained in (C4-1) was used in place of the one obtained in (1-1), and the optically anisotropic layer was formed on the first substrate on a side on which the rubbing treatment was performed. The results are collectively shown in Table 2. The optically anisotropic layer obtained in Comparative Example 4 had a hybrid orientation in a direction of 45° with respect to the short-length direction, while the optically anisotropic layer obtained in Comparative Example 5 had a homogeneous orientation state in a direction of 45° with respect to the short-length direction. The obtained optically anisotropic layers had in-plane retardations Re of 30 nm (Comparative Example 4) and 145 nm (Comparative Example 5).

Comparative Examples 6 and 7

Multilayer films were obtained and evaluated in the same manner as in Example 3 (Comparative Example 6) and in Example 6 (Comparative Example 7) except that the TAC film was not saponified. The TAC film without saponification had a surface tension of 55.0 mN/m. The results are collectively shown in Table 2. The optically anisotropic layer obtained in Comparative Example 6 was in a state of no orientation, while the optically anisotropic layer obtained in Comparative Example 7 had a homogeneous orientation state in a direction of 45° with respect to the short-length direction and an in-plane retardation Re of 139 nm.

TABLE 1

| | Ex. 1 | Ex. 2 | Ex. 3 | Ex. 4 | Ex. 5 | Ex. 6 | Ex. 7 | Ex. 8 |
|---|---|---|---|---|---|---|---|---|
| First substrate | COP corona treatment | COP-PVA layer | TAC saponification treatment | COP corona treatment | COP-PVA layer | TAC saponification treatment | COP-PVA layer | COP corona treatment |
| Substrate surface tension (mN/m) | 35.2 | 44.4 | 37.4 | 35.2 | 44.4 | 37.4 | 44.4 | 35.2 |
| Stretching direction: angle with respect to short-length direction (°) | 45 | 45 | 45 | 45 | 45 | 45 | 75, 15 | 45 |
| Stretch ratio/ stretch temperature | 1.5 times/ 145° C. | 1.5 times/ 145° C. | 1.8 times/ 185° C. | 1.5 times/ 145° C. | 1.5 times/ 145° C. | 1.8 times/ 185° C. | (75) 2.5 times/ 145° C., (15) 1.5 times/ 145° C. | 1.5 times/ 145° C. |
| Curable liquid crystal molecule | Discotic compound D1 | Discotic compound D1 | Discotic compound D1 | Rod-like compound B1 | Rod-like compound B1 | Rod-like compound B1 | Rod-like compound A1 | Rod-like liquid crystal compound A1 + compound C1 |
| Orientation direction: angle with respect to short-length direction (°) | 45 | 45 | 45 | 45 | 45 | 45 | 75, 15 | 45 |
| Orientation state | Hybrid orientation | Hybrid orientation | Hybrid orientation | Homogeneous orientation | Homogeneous orientation | Homogeneous orientation | Homogeneous orientation | Hybrid orientation |
| Surface tension of liquid crystal composition (mN/m) | 28.3 | 28.3 | 28.3 | 33.4 | 33.4 | 33.4 | 19.0 | 25 |

TABLE 1-continued

|  | Ex. 1 | Ex. 2 | Ex. 3 | Ex. 4 | Ex. 5 | Ex. 6 | Ex. 7 | Ex. 8 |
|---|---|---|---|---|---|---|---|---|
| Cross-Nicol transmittance (%) | 0.0007 | 0.0008 | 0.001 | 0.0006 | 0.0009 | 0.0012 | 15 degrees: 0.0008 75 degrees: 0.0010 | 0.001 |
| Evaluation in liquid crystal display device | Good | Good | Good | — | — | — | — | Good |
| Evaluation in OLED | — | — | — | Good | Good | Good | Good | — |

TABLE 2

|  | Comp. Ex. 1 | Comp. Ex. 2 | Comp. Ex. 3 | Comp. Ex. 4 | Comp. Ex. 5 | Comp. Ex. 6 | Comp. Ex. 7 |
|---|---|---|---|---|---|---|---|
| First substrate | COP | COP | COP-PVA layer | COP | COP | TAC | TAC |
| Substrate surface tension (mN/m) | 34.0 | 34.0 | 50.2 | 31.7 | 31.7 | 55.0 | 55.0 |
| Stretching direction: angle with respect to short-length direction (°) | 45 | 45 | 45 | (45° rubbing) | (45° rubbing) | 45 | 45 |
| Stretch ratio/stretch temperature | 1.5 times/ 145° C. | 1.5 times/ 145° C. | 1.5 times/ 145° C. | — | — | 1.8 times/ 185° C. | 1.8 times/ 185° C. |
| Curable liquid crystal molecule | Discotic compound D1 | Rod-like compound B1 | Discotic compound D1 | Discotic compound D1 | Rod-like compound B1 | Discotic compound D1 | Rod-like compound B1 |
| Orientation direction: angle with respect to short-length direction (°) | No orientation | 45 | 45 Poor orientation | 45 | 45 | No orientation | 45 |
| Orientation state | No orientation | Homogeneous orientation | Poor orientation | Hybrid orientation | Homogeneous orientation | No orientation | Homogeneous orientation |
| Surface tension of liquid crystal composition (mN/m) | 28.3 | 33.4 | 28.3 | 28.3 | 33.4 | 28.3 | 33.4 |
| Cross-Nicol transmittance (%) | 5.21 | 0.08 | 0.10 | 0.05 | 0.06 | 4.52 | 0.03 |
| Evaluation in liquid crystal display device | Poor | — | Poor | Poor | — | Poor | — |
| Evaluation in OLED | — | Poor | — | — | Poor | — | Poor |

As is evident from the results in Tables 1 and 2, Examples of the present application demonstrated that the multilayer film having the optically anisotropic layer capable of exhibiting sufficient orientation to achieve the excellent display quality when used in the display device can be efficiently produced in the production method including the step of imparting the orientation-regulation force to the substrate by the stretching treatment.

REFERENCE SIGN LIST

11: discotic liquid crystal compound
21: orientation direction of the first substrate by the stretching
22: polar angle 0° direction
304: polarizer
300: circularly polarizing plate
A34: absorption axis of the polarizing plate A31: short-length direction
303: λ/2 wave plate
A33: slow axis
302: λ/4 wave plate
A32: slow axis
401: thin tube
402: droplet

The invention claimed is:

1. A multilayer film comprising: a first long-length substrate; and an optically anisotropic layer containing cured liquid crystal molecules, the optically anisotropic layer being directly disposed on a surface of the first substrate, wherein
the first substrate consists of a support body having one or more layers,
the surface of the first substrate has a surface tension of 35 to 45 mN/m and an orientation-regulation force generated by stretching, and
the optically anisotropic layer has a slow axis along approximately the same direction as an orientation direction of the first substrate by the stretching.

2. The multilayer film according to claim 1, wherein the first substrate comprises a plurality of layers.

3. The multilayer film according to claim 1, wherein the cured liquid crystal molecule is a cured product of a discotic liquid crystal compound.

4. The multilayer film according to claim 1, wherein the cured liquid crystal molecule is a cured product of a rod-like liquid crystal compound.

5. A method for producing the multilayer film according to claim 1, comprising:
applying a liquid crystal composition containing a curable liquid crystal compound onto a first long-length substrate to form a layer of the liquid crystal composition;
subjecting the curable liquid crystal compound in the layer of the liquid crystal composition to homogeneous orientation or hybrid orientation along approximately the same direction as an orientation direction of the first substrate by stretching; and
polymerizing the curable liquid crystal compound to form cured liquid crystal molecules, wherein
the first substrate consists of a support body having one or more layers,
the surface of the first substrate has a surface tension of 35 to 45 mN/m, and
the liquid crystal composition is a liquid having a surface tension of less than 35 mN/m.

6. The production method according to claim 5, wherein the liquid crystal composition is a liquid having a surface tension of 20 mN/m or more and less than 35 mN/m.

7. The production method according to claim 5, wherein the liquid crystal composition is a liquid having a surface tension of 20 to 33.4 mN/m.

8. The production method according to claim 5, wherein the first substrate comprises an alicyclic structure-containing polymer.

9. A method for producing an optical compensation sheet, comprising:
separating, from the multilayer film according to claim 1, the optically anisotropic layer; and
bonding the optically anisotropic layer to a second substrate.

10. The production method according to claim 9, wherein the first substrate comprises a plurality of layers.

11. The production method according to claim 9, wherein the cured liquid crystal molecule is a cured product of a discotic liquid crystal compound.

12. A method for producing a polarizing plate comprising an optical compensation sheet, comprising:
producing the optical compensation sheet by the production method according to claim 9.

13. A method for producing a liquid crystal display device comprising a polarizing plate, comprising:
producing the polarizing plate by the production method according to claim 12.

14. A method for producing a λ/4 wave plate, comprising:
separating, from the multilayer film according to claim 1, the optically anisotropic layer; and
bonding the optically anisotropic layer to a second substrate.

15. The production method according to claim 14, wherein the first substrate comprises a plurality of layers.

16. The production method according to claim 14, wherein the cured liquid crystal molecule is a cured product of a rod-like liquid crystal compound.

17. A method for producing a circularly polarizing plate comprising a λ/4 wave plate, comprising:
producing the λ/4 wave plate by the production method according to claim 14.

18. A method for producing an organic electroluminescent display device comprising a circularly polarizing plate, comprising:
producing the circularly polarizing plate by the production method according to claim 17.

19. The multilayer film according to claim 1, wherein the first substrate comprises an alicyclic structure-containing polymer.

* * * * *